(12) United States Patent
Yamada et al.

(10) Patent No.: US 6,842,663 B2
(45) Date of Patent: Jan. 11, 2005

(54) PRODUCTION MANAGING SYSTEM OF SEMICONDUCTOR DEVICE

(75) Inventors: Keizo Yamada, Tokyo (JP); Yousuke Itagaki, Tokyo (JP); Takeo Ushiki, Tokyo (JP); Tohru Tsujide, Tokyo (JP)

(73) Assignee: Fab Solutions, Inc., Kanagawa (JP)

( * ) Notice: Subject to any disclaimer, the term of this patent is extended or adjusted under 35 U.S.C. 154(b) by 0 days.

(21) Appl. No.: 10/790,276

(22) Filed: Mar. 1, 2004

(65) Prior Publication Data

US 2004/0167656 A1 Aug. 26, 2004

Related U.S. Application Data

(63) Continuation of application No. 10/082,247, filed on Feb. 26, 2002, now Pat. No. 6,711,453.

(30) Foreign Application Priority Data

Mar. 1, 2001 (JP) ...................................... 2001/056953

(51) Int. Cl.$^7$ .............................................. G06F 19/99
(52) U.S. Cl. .......................... 700/121; 700/108; 438/14
(58) Field of Search ................................ 700/121, 108; 438/14

(56) References Cited

U.S. PATENT DOCUMENTS

| | | | |
|---|---|---|---|
| 3,614,608 A | | 10/1971 | Giedd |
| 4,571,685 A | * | 2/1986 | Kamoshida ................. 700/121 |
| 4,949,162 A | | 8/1990 | Tamaki et al. |
| 4,988,877 A | | 1/1991 | Stokowksi et al. |
| 5,001,536 A | | 3/1991 | Fukuzawa et al. |
| 5,089,774 A | | 2/1992 | Nakano |
| 5,132,507 A | | 7/1992 | Nakano |
| 5,280,176 A | | 1/1994 | Jach et al. |
| 5,327,012 A | | 7/1994 | Yano et al. |
| 5,365,034 A | | 11/1994 | Kawamura et al. |
| 5,412,210 A | | 5/1995 | Todokoro et al. |
| 5,453,994 A | | 9/1995 | Kawamoto et al. |
| 5,493,236 A | | 2/1996 | Ishii et al. |
| 5,637,186 A | | 6/1997 | Liu et al. |
| 5,757,198 A | | 5/1998 | Shida et al. |
| 6,055,463 A | * | 4/2000 | Cheong et al. ................ 702/82 |
| 6,314,379 B1 | * | 11/2001 | Hu et al. ..................... 700/121 |
| 6,338,001 B1 | * | 1/2002 | Steffan et al. .............. 700/121 |
| 6,542,830 B1 | * | 4/2003 | Mizuno et al. ............. 700/121 |

FOREIGN PATENT DOCUMENTS

| | | |
|---|---|---|
| JP | 56-63990 | 5/1975 |
| JP | 57-6310 | 1/1982 |
| JP | 62-19707 | 1/1987 |

(List continued on next page.)

Primary Examiner—Albert W. Paladini
(74) Attorney, Agent, or Firm—Neil A. Steinberg

(57) ABSTRACT

A production managing system for semiconductor devices includes, in a semiconductor producing center C, production devices 11a–11c for producing semiconductor devices, in-line measuring devices 12a–12c for measuring data of a lot, a database 2 storing data of production methods, the measured data, the specifications of the process steps corresponding to the measured data, the estimated yield, the data of lot input date and hour, the data of the scheduled date on which the process step is performed, the data of actual date of completion in every step and the data of the scheduled date of completion of the semiconductor devices of every lot, correspondingly to a lot number data of the semiconductor devices (chips) and a server 1 including an estimated yield operating unit 1a for calculating the estimated yield, which is a final yield, on the basis of the specifications and the measured data, and a production managing unit 1b for performing a production management of semiconductor devices ordered by a user on the basis of the respective data inputted by the user and the estimated yield, wherein a user terminal of the user not only performs a determination whether or not the process processing in every process is normal but also estimates the final number of normal products ordered by the user and obtainable finally.

11 Claims, 16 Drawing Sheets

FOREIGN PATENT DOCUMENTS

| | | |
|---|---|---|
| JP | 63-9807 | 1/1988 |
| JP | 03-205573 | 9/1991 |
| JP | 04-062857 | 2/1992 |
| JP | 06-273297 | 9/1994 |
| JP | 07-066172 | 3/1995 |
| JP | 08-005528 | 1/1996 |
| JP | 08-313244 | 11/1996 |
| JP | 09-061142 | 3/1997 |
| JP | 10-281746 | 10/1998 |
| JP | 10-300450 | 11/1998 |
| JP | 11-026343 | 1/1999 |
| JP | 2000-124276 | 4/2000 |
| JP | 2000-164715 | 6/2000 |
| JP | 2000-174077 | 6/2000 |
| JP | 2000-180143 | 6/2000 |

* cited by examiner

| process step No. | process step 1a | process step 1b | |
|---|---|---|---|
| upper limit | $2\mu m^2$(0.YY) | $12.6\mu m^2$(0.VV) | |
| lower limit | $1.5\mu m^2$(0.XX) | $0.7\mu m^2$(0.ZZ) | |
| flat area start position | 4 | 5 | |
| flat area end position | 80 | 40 | |

Fig. 10

| production line number | design rule |
|---|---|
| line 1 | 0.1–0.13 $\mu$m |
| line 2 | 0.13–0.15 $\mu$m |
| line 3 | 0.15–0.18 $\mu$m |
| line 4 | 0.18–0.25 $\mu$m |
| line 5 | 0.25–0.35 $\mu$m |
| line 6 | 0.5 $\mu$m or more |

Fig. 11

1 fast delivery priority
2 delivery number priority
3 total cost priority
4 quality priority

Fig. 12

| | order form | | | | process step 1a | | | process step 1b | | |
|---|---|---|---|---|---|---|---|---|---|---|
| user name | product name | lot number | production method | line name | prearranged date | date of completion | estimated yield | prearranged date | date of completion | estimated yield |
| CCC1 | alpha | xx | fast delivery priority | Line 1 | 10/8 | 10/9 | 90(%) | 10/10 | 10/10 | 80(%) |

Fig. 13 user ID=10000    product name = alpha            200/11/20

| | 10/10 | 10/20 | 11/10 | 11/20 | 11/22 |
|---|---|---|---|---|---|
| date of calculation | input date | | | | |
| current process step | | Contact (1a, 1b) | thin film (2a, 2b) | wiring | wiring |
| prearranged date of completion | 12/24 | 12/24 | 12/24 | 12/24 | 12/24 |
| predicted delivery number of products | 100 | 90 | 90 | 50 | 80 |
| unit cost of chip | 1,000,000 yen | 1,100,000 yen | 1,100,000 yen | 2,000,000 yen | 1,380,000 yen |
| total cost | 100,000,000 yen | 100,000,000 yen | 100,000,000 yen | 100,000,000 yen | 110,000,000 yen |
| remarks | | | | 100% re-working selected | 100% re-working |

Fig. 14

| production method (lot number) | mixing ratio(%) |
|---|---|
| production method 1 (XXA) | 60 |
| production method 2 (XXB) | 20 |
| production method 3 (XXC) | 20 |
| fowarding date = December 24 predicted number of normal products=70 predicted cost of chip=1,000,000 yen | | wafer input portfolio

Fig. 15

| user ID | YAMANE |
|---|---|
| password | **** |

Fig. 19

| new lot input |
|---|
| production management |

Fig. 20 course 1 no division
course 2 divide by two
course 3 conditional branching

Fig. 21

1 100% continuation
2 50% continuation
3 stoppage

Fig. 22

PRODUCTION MANAGING SYSTEM OF SEMICONDUCTOR DEVICE

RELATED APPLICATIONS

This application is a continuation of application Ser. No. 10/082,247, filed Feb. 26, 2002, now U.S. Pat. No. 6,711,453 which claims benefit of priority under 35 U.S.C. § 119 to Japanese Patent Application No. 2001-056953, filed on Mar. 1, 2001.

BACKGROUND OF THE INVENTION

1. Field of the Invention

The present invention relates to a production managing system of semiconductor devices in which a production of semiconductor devices is managed by a remote user by using an information communication line such as an internet, etc.

2. Description of Related Art

The production management of semiconductor devices ordered by a user has been performed by a semiconductor device manufacturer by measuring parameters of the semiconductor devices in respective production process steps thereof along a production line and checking the measured parameters on whether or not the parameters are within predetermined specifications.

That is, for example, thickness of a thin film formed on a substrate is checked on whether or not its thickness is within a thickness specification thereof in the forming step of the thin film and a wiring pattern is checked on whether or not a width thereof is within a width specification of the wiring pattern in a wiring pattern forming step in which the wiring pattern is formed by etching the thin film through a photolithographic step.

However, a production management in these checks is to merely determine whether or not a result of check is acceptable.

Final yield of semiconductor device, that is, the number of semiconductor devices obtained finally as acceptable products, is confirmed by confirming electrical characteristics and operations of completed semiconductor devices, which are functionally acceptable, by using a semiconductor tester.

Therefore, it is usual that a user who ordered the semiconductor devices can not know the number of normal semiconductor devices, which are practically obtained, before the production of all of them is completed.

As mentioned above, since, in the conventional production management of semiconductor devices, it is impossible for the user to know the number of finally obtainable normal semiconductor devices in every process and to confirm the number of normal semiconductor devices having acceptable electric characteristics before the semiconductor devices are completed, the user can not know the number of normal products until the semiconductor devices are delivered to the user.

Therefore, if a result obtained in the check in every process can not be detected by usual check in the conventional production management, there may be a case where the number of completed products delivered to the user is smaller than the number of products ordered by the user.

Therefore, when the shortage of the number of normal products is confirmed after the number of normal products is confirmed, it is necessary for the user to throw in a lot (constituted with in unit of wafer or wafers) again for production of semiconductor devices the number of which corresponds to the shortage. However, the production of semiconductor devices of the newly thrown lot usually takes about two months from the throwing-in of the lot to a completion of the semiconductor devices. Therefore, in the case where the number of normal products is short due to abnormality of process, a production schedule thereof is delayed substantially.

SUMMARY OF THE INVENTION

The present invention was made under the circumstances and has an object to provide a production managing system of semiconductor devices, which is capable of estimating not only the quality of processing in every process step but also the number of finally obtainable normal semiconductor devices ordered by a user in every process step such as contact-hole forming step.

The production managing system according to the present invention is featured by comprising, in a semiconductor device producing center connected to at least one usr terminal through an information communication line, a plurality of production devices for performing production processes in respective process steps, a corresponding number of in-line measuring devices provided next to the respective production devices, for measuring process parameters corresponding to the respective process steps of the production devices and outputting results of the measurements in units of lot of semiconductor devices as measured data, a database storing, for each wafer group including one or more wafers, data of production method for producing semiconductor devices, the measured data, specifications of the process steps corresponding to the measured data, estimated yields, data of the date and hour of an input of the lot, data of the scheduled date on which each process step is performed, data of actual date of completion of every step and data of the scheduled date of completion of the semiconductor devices, correspondingly to lot number data of the semiconductor devices and a server including an estimated yield operating unit for calculating the estimated yield, which is a final yield, on the basis of the specifications and the measured data, and a production managing unit for performing a production management of semiconductor devices ordered by a user on the basis of the respective data inputted by the user and the estimated yields, wherein the server performs write and read of the respective data inputted from the user terminal with respect to the database.

In this production managing system, the production managing unit manages the production of semiconductor devices by producing process control tables for the respective wafer groups, each of which is composed of the data of scheduled date and hour of each of the process steps used for the lot management, on the basis of the production method data, the data of lot input date and hour and the data of scheduled date of completion and controlling the process steps of the respective lots on the basis of the process control tables.

In this production managing system, the estimated yield operating unit calculates the estimated final yield after the process steps of the lot is completed and the process parameters are measured on the basis of the specifications, on the basis of statistical values of the measured data, the specifications and old data.

In this production managing system, the user terminal outputs the specifications inputted by the user for respective process steps, data of measuring positions indicative of positions on the wafer to be measured and element data indicative of the kind of elements to be measured to the server together with the lot number and the server writes the inputted specifications, the measuring position data and the element data, in regions of the semiconductor devices corresponding to the lot number data in the database.

In this production managing system, the user terminal outputs data of re-input date and re-inputted wafer number inputted by the user correspondingly to the estimated yield to the server and the server writes the scheduled process data for every step of the lot having the wafers corresponding to the re-inputted wafer number data, correspondingly to the production schedule based on the re-input date data and the re-inputted wafer number data.

In this production managing system, when the estimated yield estimated by the measurement result in every step is lower than a minimum yield assigned by the user, the production managing unit notifies the user terminal of the detection result.

In this production managing system, the in-line measuring devices irradiate through-holes, which are formed in an insulating film for electrical connection between wiring patterns laminated on both sides of the insulating film, with electron beam, measures electric current values flowing correspondingly to configurations of the through-holes and outputs the measured current values as the measured data.

In this production managing system, the estimated yield operation unit may calculate an estimated yield in every step on the basis of old data, calculate the number of normal products of every wafer group on the basis of the estimated yield and calculate an estimated cost of the semiconductor device on the basis of the number of normal products and the working ratio of the production devices.

A production managing method for semiconductor devices, according to the present invention, comprises the steps of inputting at least data of method for producing semiconductor devices, measured data, specifications of the process step corresponding to the measured data, data of lot input date and hour, data of scheduled process step date, data of actual date of completion in every step and data of scheduled date of completion of the semiconductor devices, all of which are inputted by a user through a user terminal for every wafer group including at least one wafer, storing the data of method for producing semiconductor devices, the measured data, the specifications of the step corresponding to the measured data, the data of lot input date and hour, the data of scheduled process step date, the data of actual date of completion in every step and the data of scheduled date of completion of the semiconductor devices in a database, performing process processing corresponding to the process steps performed sequentially in each of a plurality of production devices, measuring process parameters corresponding to process in every of the process steps, calculating an estimated yield, which is a final yield, in every wafer group on the basis of the measured parameter data and the specification in every step and storing these data for every wafer group in the database, wherein the production management of the semiconductor devices ordered by the user is performed on the basis of the respective data inputted by the user and the estimated yield.

A production managing program of the present invention, for performing a semiconductor production management by using the production managing system mentioned above, comprises the steps of inputting at least the data of method for producing semiconductor devices, the measured data, the specifications of the process step corresponding to the measured data, the data of lot input date and hour, the data of scheduled process step date, the data of actual date of completion in every step and data of scheduled date of completion of the semiconductor devices, all of which are inputted by the user through the user terminal for every wafer group including at least one wafer, storing the method data, the measured data, the specifications of the step corresponding to the measured data, the data, of lot input date and hour, the data of scheduled process step date, the data of actual date of completion in every step and the data of scheduled date of completion of the semiconductor devices in the database, performing process processing corresponding to process steps performed sequentially in each of the production devices, measuring process parameters corresponding to process in every process step, calculating an estimated yield, which is a final yield, in every wafer group on the basis of the measured parameter data and the specification in every step and storing these data for every wafer group in the database, wherein the production management of the semiconductor devices ordered by the user is performed by a computer on the basis of the respective data inputted by the user and the estimated yield.

BRIEF DESCRIPTION OF THE DRAWINGS

Embodiments of the present invention will be described with reference to the accompanying drawings, in which:

FIG. 10 is a table showing upper limit/lower limit values of process parameters in every step;

FIG. 11 is a table showing a range of minimum line width, which can be manufactured in each line, for setting a production line;

FIG. 12 is a table showing selectable production method for selecting a lot production method;

FIG. 13 is a step managing table for performing a lot production management by a production managing unit 1b;

FIG. 14 is a step managing table for performing a lot production management by a production managing unit 1b;

FIG. 15 is a table showing a portfolio construction of a lot under production;

FIG. 19 is a conceptual figure showing a screen to which a user ID and a password are inputted;

FIG. 20 is a conceptual figure showing a screen for performing the processing selection by the user in the flowchart shown in FIG. 16;

FIG. 21 is a conceptual figure showing a screen for performing a selection of course for performing a division of lot; and FIG. 22 is a conceptual figure showing a screen for selecting subsequent production of the lot.

DETAILED DESCRIPTION OF THE PREFERRED EMBODIMENTS

Figure 1:
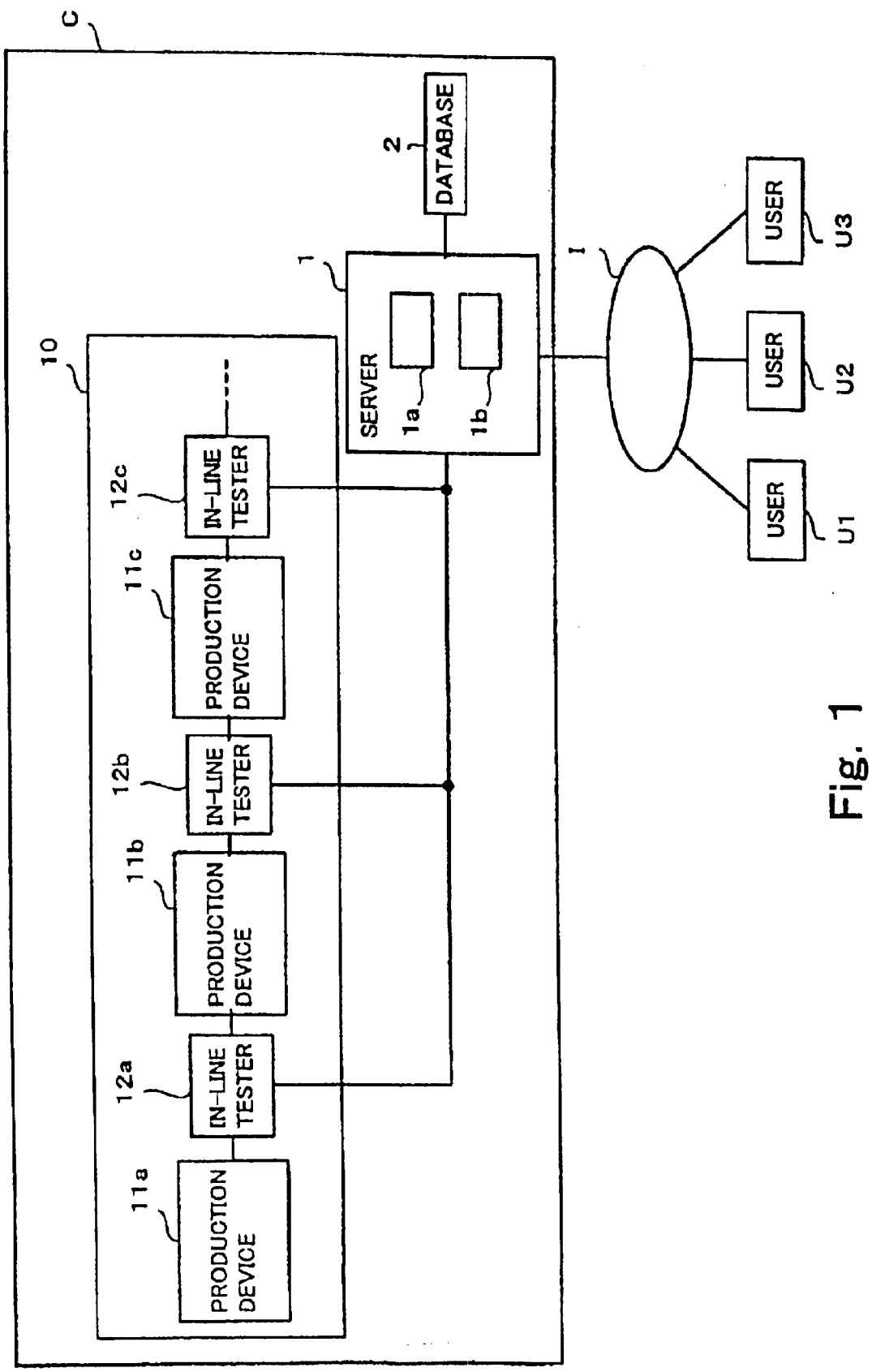
FIG. 1 is a block diagram showing a construction of a production managing system for semiconductor devices, according to an embodiment of the present invention.

FIG. 1 is a block diagram showing a construction of a production managing system of semiconductor devices according to an embodiment of the present invention.

The semiconductor device production managing system of the present invention is basically constructed with a semiconductor producing center C and a plurality of user terminals U1, U2, U3, . . . , which are connected to the semiconductor producing center C through an internet.

The semiconductor producing center C includes a production line 10, a server 1 and a database 2 are provided. The server 1 is connected to the user terminals U1, U2, U3, . . . , which are constructed with personal computers, etc., respectively, through an information communication line I.

The information communication line I may be an internet, ISDN (Integrated Services Digital Network) or public telephone line, etc.

The server 1 transmits data to and receives data from the user terminals U1, U2, U3, . . . , through the information communication line I.

The production line 10 includes production devices 11a, 11b, 11c, . . . , for performing respective process steps for producing semiconductor devices. The production devices are arranged in series in the order of the process steps of a production method.

In the production line 10, in-line testers 12a, 12b, 12c, . . . , are provided next to the respective production devices 11a, 11b, 11c, . . . .

The in-line testers 12a, 12b, 12c, . . . , measure process parameters of chips located in predetermined positions of a wafer or wafers in a lot in the respective process steps executed by the respective production devices 11a, 11b, 11c, and output result of the measurement as measured data, respectively.

The most important feature of the present invention is that the measured data obtained by the in-line testers 12a, 12b, 12c, . . . , are stored in the database 2 correspondingly to a lot number of the lot and a user who inputs the lot flowing through the production line 10 performs the production management of the lot through the information communication line I on the basis of test data stored in the database 2, by himself.

In this specification, the term "lot" means a processing unit of production regardless of the number of wafers in the lot.

That is, in a case where only one wafer is flown as a unit when a lot is divided or when a trial production is performed, semiconductor devices are produced on the one wafer through process steps independently from other lots, so that it is necessary to perform the production management for the one wafer as a lot.

In such case, values of specifications of the process parameters assigned by the user are used.

The server 1 calculates a step yield (for example, indicated by % unit) in every process step on the basis of the specifications, the measured data and correction values and the calculated step yields are stored together with wafer number data indicative of the number of the wafers constituting each lot in the database 2 correspondingly to the lot number of every lot.

A final estimated yield of the production line is calculated by the estimated yield operation unit 1a of the server 1 at a time when all of the process steps are completed on the basis of the step yields in the respective process steps, which are obtained by comparing the measured data obtained by the in-line testers after each process step is completed with the corresponding specifications, under assumption that step yields in all of subsequent process steps are 100%, respectively.

Therefore, the user can confirm the number of the semiconductor devices, that is, the chips, which can be delivered finally, on the basis of the estimated yield calculated every time when the process of each step is completed.

That is, in the semiconductor device production managing system of the present invention, the user can confirm the estimated number of the semiconductor devices, which can be finally delivered, at the time when the respective process steps of the inputted lot are completed and, when the estimated number of the semiconductor devices is smaller than the desired number, can perform the production management such as input of a new lot.

Returning to FIG. 1, the construction of the production managing system of semiconductor devices, according to the present invention will be described in more detail.

The production device 11a may be a device for forming through-holes in an insulating film by etching the insulating film of a semiconductor device subsequent to a photolithographic processing therefor.

That is, the production device 11a forms contact holes or via-holes in the insulating film for connecting a diffusion layer (or a wiring layer) formed on one surface of the insulating film to a wiring layer formed later on the other surface of the insulating film.

The production device 11a performs the step of painting an upper surface of the insulating film with resist and the step of forming a patterned contact holes in the resist film by a photolithographic processing with using a mask having the contact hole pattern.

Further, the anisotropic etching of the contact hole pattern of the resist film is performed by an etching device of the production device 11a to form the patterned contact holes in the insulating film.

That is, the production device 11a may be constructed with, for example, a stepper for performing the photolithographic processing and the etching device.

Incidentally, before the anisotropic etching step performed in the production device 11a, the diffusion step for diffusing impurity in a silicon substrate and the insulating film depositing step for depositing a silicon oxide film on the upper surface of the diffusion layer as an interlayer insulating film are performed.

In FIG. 1, a device for forming the insulating film and other devices such as an ion plantation device are not shown.

The production device 11b may be a CVD (Chemical Vapor Deposition) device for depositing an electrically conductive thin film, which is patterned to form a wiring between transistors.

Further, the production device 11c may be used to pattern the thin film deposited by the production device 11b.

That is, the production device 11c is a device for etching the electrically conductive thin film subsequent to the photolithographic processing to form the wiring pattern.

In the production device 11c, the step of painting an upper surface of the electrically conductive thin film with resist material and the step of forming the wiring pattern in the resist film by performing a photolithographic processing with using the mask having the wiring pattern are performed.

The anisotropic etching step for patterning the wiring resist is performed by the etching device of the production device 11c to form the contact holes corresponding to the pattern in the insulating film.

That is, the production device 11c may be constructed with, for example, a stepper for performing the photolithographic processing and the etching device.

The in-line tester 12a measures, as the process parameters of the process steps performed by the production device 11a, diameters of the patterned contact-holes formed in the resist film after the photolithographic processing, which is preceding the etching step by means of the etching device, is performed and bottom areas of the contact-holes formed in the insulating film after the etching is performed by the etching device and outputs the diameters and the bottom areas of the contact-holes to the server 1 as the measured data together with the lot number.

Figure 2A:
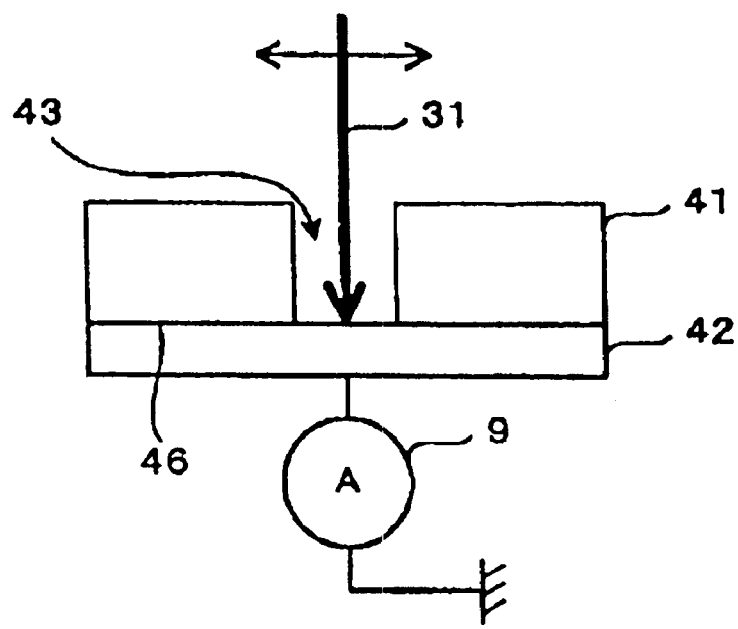
FIG. 2a and FIG. 2b are conceptual figures for explaining a measurement of a bottom area of a contact hole by means of electron beam in a device used as an example of an in-line test device 12a shown in FIG. 1.

That is, as shown in FIG. 2A, the contact-hole 43 or a via-hole, which is not shown, is irradiated with an electron beam 31. In this case, when the contact hole or via hole is circular, the electron beam 31 may have a rectangular cross section having longer side larger than the diameter of the contact hole or via-hole.

An electric current generated by irradiation of the electron beam 31 is detected by an ammeter 9 of the in-line tester 12a.

In this case, when the electron beam 31 irradiates the insulating film 41, a minute current flowing through the insulating film 41 is detected.

On the other hand, when the electron beam 31 irradiates the contact hole 43, the underlying semiconductor substrate 42 is irradiated with the electron beam 31. Therefore, a current, which is larger than that detected when the electron beam 31 irradiates the insulating film 41, is detected by the ammeter 9 (FIG. 2B).

That is, the in-line tester 12a measures the current flowing correspondingly to the area of a portion of the underlying substrate 42, which is exposed through the contact hole 43 and the bottom area of the contact hole 43 can be estimated by comparing an integrated value of the measured current with an integrated current value preliminarily obtained for a unit area.

Figure 2B:
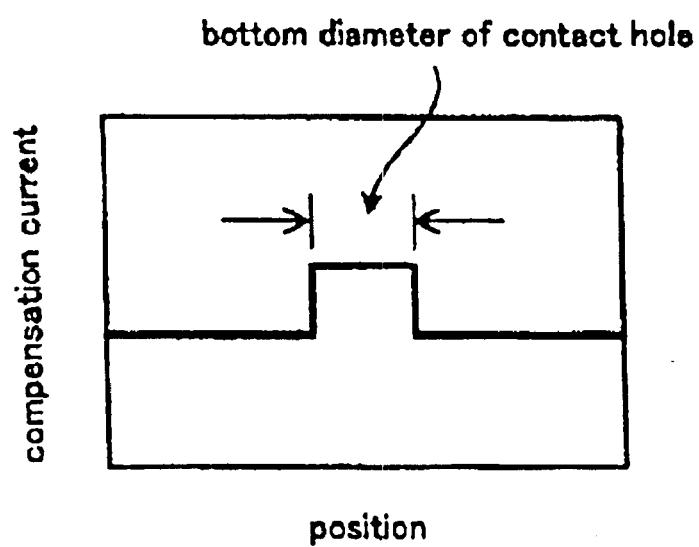
Figure 3A:
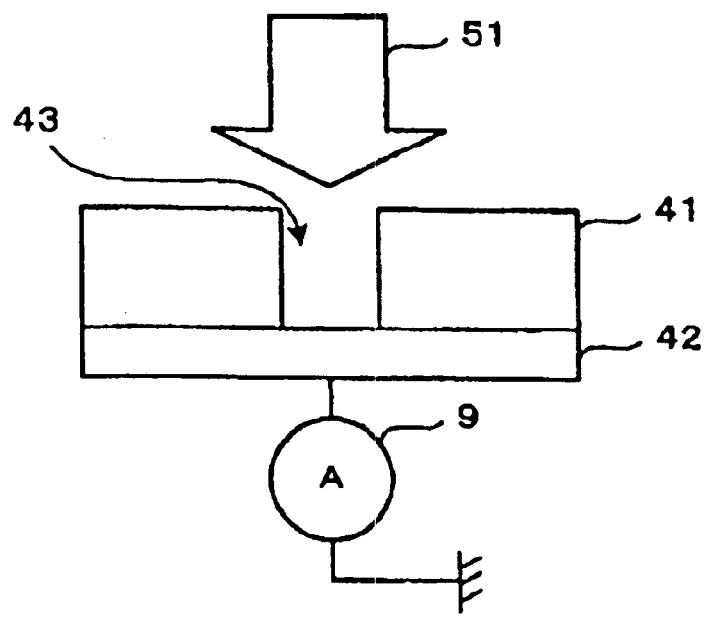
FIG. 3a and FIG. 3b are conceptual figures for explaining a measurement of a bottom area of a contact hole by means of electron beam in a device used as an example of an in-line test device 12b shown in FIG. 1.
Figure 3B:
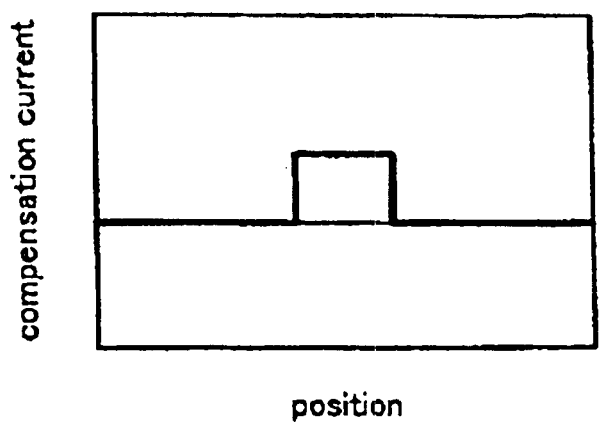

Alternatively, when an electron beam 51 having cross sectional area larger than an area of the contact hole 43 or a via-hole is used as shown in FIG. 3A, a current, which is large compared with that obtainable when the insulating film 41 is irradiated with the electron beam, is detected by the ammeter 9 as shown in FIG. 3B similarly to the case shown in FIG. 2A or 2B.

Since, in the latter case, it is possible to measure the current of the whole contact hole simultaneously, the detection current has a value corresponding to the bottom area of the contact hole.

Alternatively, the bottom area of the contact hole 43 may be estimated by preliminarily measuring an integrated value of current generated in a unit area by electron beam and comparing the integrated value with the current value measured by the in-line tester 12a.

The in-line tester 12b measures thickness of the deposited thin film and a sheet resistance of the thin film as the process parameters of the process steps of the production device 11b and outputs the parameters to the server 1 together with the lot number.

The in-line tester 12c measures width of the wiring pattern of the resist after the photolithographic processing step, which is preceding the etching step in the etching device, is performed and determines an existence of a wiring defect after the etching step by the etching device, as the process parameters in the steps of the production device 11c, and outputs the width and the existence to the server 1 together with the lot number.

In this case, the measurement of the width of the wiring pattern of the resist may be performed by using a stylus type device.

Figure 4A:
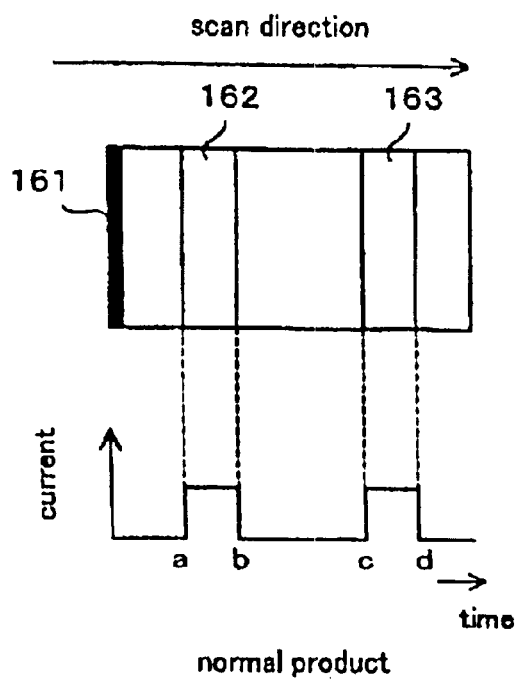
FIG. 4a and FIG. 4b are conceptual figures for explaining a measurement of a width of a wiring formed of an electrically conductive material by means of electron beam in a device used as an example of an in-line test device 12c shown in FIG. 1.
Figure 4B:
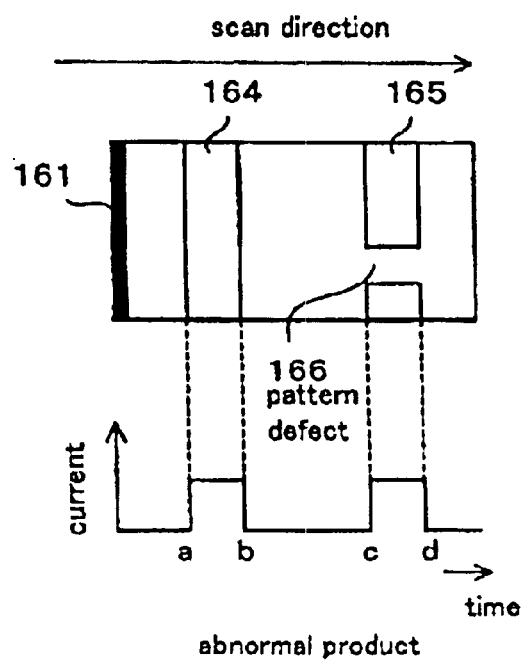

As to the existence of the wiring defect after the etching step, it is determined by using electron beam similarly to the in-line tester 12a, as shown in FIG. 4A and FIG. 4B. In FIG. 4A and FIG. 4B, are conceptual figures for explaining the test for determining an existence of the wiring pattern defect by means of electron beam and, particularly, the test in a case where the wiring pattern having longitudinal line portions of identical configuration, in which FIG. 4A shows a case of a normal chip and FIG. 4B shows a case of abnormal chip having a wiring pattern defect.

In FIG. 4A and FIG. 4B, electron beam having a rectangular cross sectional area, which is 10 nm wide in a scan direction and several $\mu$m long, irradiates measuring areas of the respective chips.

Current value obtainable by the current measuring method, which is the principle of this measuring method, is a total value of currents generated in the wiring patterns, which are irradiated simultaneously with electron beam.

That is, the in-line tester 12c measures a current value, which is a total current obtained as a sum of currents generated when the respective pattern portions of the wiring pattern are irradiated with electron beam having a line rectangular cross sectional area.

In the examples of measurement shown in FIG. 4A and FIG. 4B, when electron beam 161 passes through positions a to positions b of the pattern 162 and 164, currents having similar values are detected regardless of the quality of chip.

On the other hand, when the electron beam 161 passes through positions c to positions d, current due to the wiring 163 is measured in the normal chip while current measured due to the wiring 165 of the abnormal chip is smaller than the current measured due to the normal chip.

Therefore, there is a considerable difference in waveform between the normal and abnormal chips on which an existence of a wiring pattern defect 166 is detected.

That is, it is possible to detect an abnormal chip and specify a defective position thereof by scanning the chip with the electron beam 161 even when the defect thereof is a positional overlapping of the wiring.

In the above mentioned measurement, the process parameters are measured in every step by selecting a plurality or all of the wafers in each lot and performing the measurement at chips located in a plurality positions of each wafer in the lot.

Figure 5:
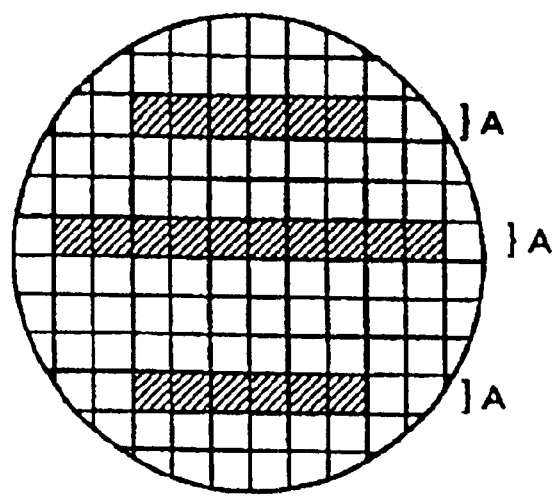
FIG. 5 is a conceptual figure of a wafer for explaining measuring position data indicative of a measuring position within the wafer.

As shown in FIG. 5, the measuring positions are preliminarily assigned by the user as measuring regions A indicative of the chips in the wafer to be measured. Measuring position data indicative of the measuring positions is inputted by the user through the user terminal U1 to the semiconductor producing center C and stored in the database 2 thereof correspondingly to the lot number by the server 1.

Further, the user can select configuration and kind of an element, which can be used to calculate a clear estimated yield in every lot, from TEG (Test Element Group) arranged in each chip and indicated by the measuring position data for every process parameter.

Figure 6:
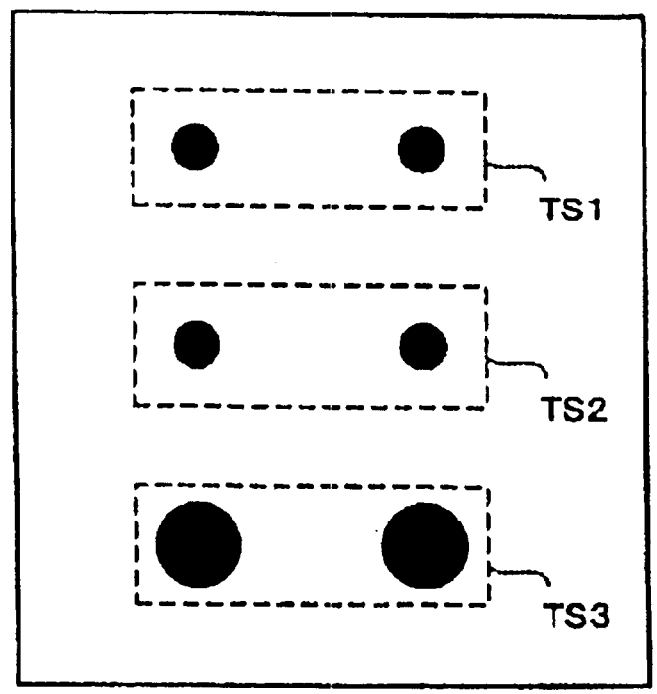
FIG. 6 is a conceptual figure for explaining element data of an element to be measured.

For example, in a case where a bottom area of a contact hole is to be measured, the user selects one of test elements TS1, TS2 and TS3 of circular contact holes having different diameters, as shown in FIG. 6, which is suitable in a current lot.

The element data indicating this measuring element is inputted by the user to the user terminal U1, transmitted to the server 1 and stored in the database 2 together with the lot number.

Further, the in-line testers 12a, 12b, 12c, . . . , determine whether or not the measured data of every chip of the wafers measured in every step are within predetermined ranges of specifications and output a result of the determinations to the server 1.

Figure 7:
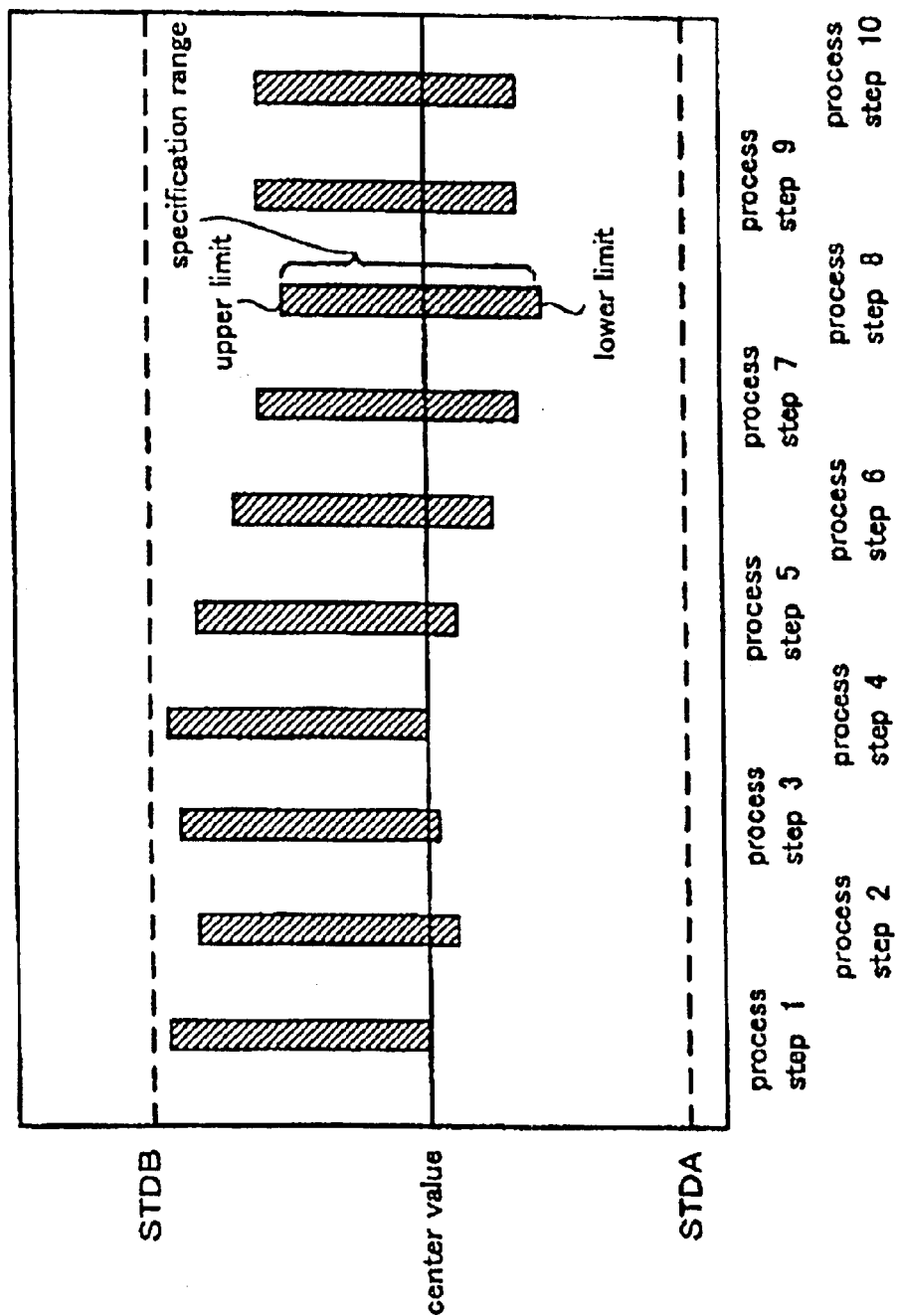
FIG. 7 is a conceptual figure showing a setting table showing an upper and lower limits of a range of specifications of respective process parameters in every step.

The specifications are set in every step corresponding to the process flow to every lot, as shown in FIG. 7.

FIG. 7 is a conceptual figure showing a setting table indicative of an upper and lower limits of a range of each specification in every step. In FIG. 7, a center value means a center value of each process parameter when a usual step processing is performed in each production device, that is, a peak value of a Poisson distribution such as shown in FIG. 8.

Figure 8:
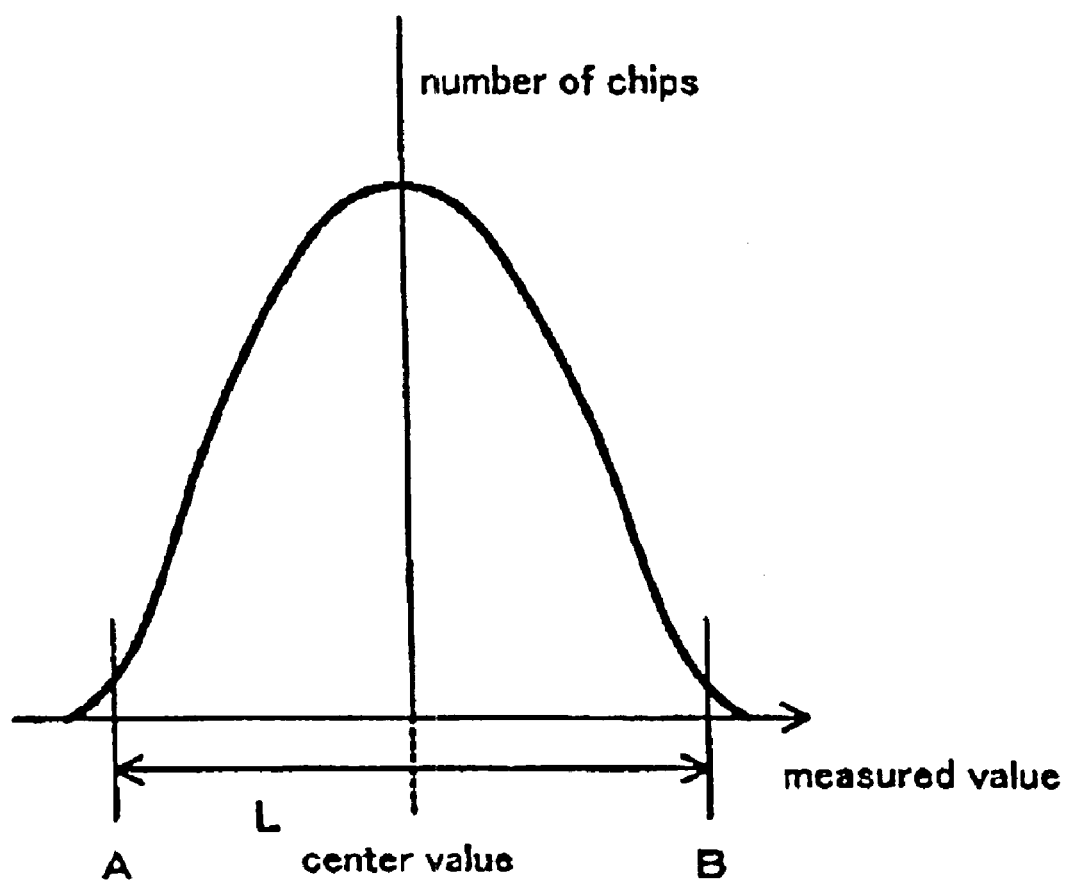
FIG. 8 is a conceptual figure showing Poisson distribution used in obtaining a range of the standardized parameters.

The range of the specification shown in FIG. 7 in which the measured data are to be fallen is determined by standardizing a range L of the measured value in FIG. 8. That is, a standardized value STDA in FIG. 7 is obtained by standardizing the measured value A in FIG. 8 and a standardized value STDB in FIG. 7 is obtained by standardizing the measured value B in FIG. 8.

With using the table shown in FIG. 7, the user defines the range of specification between the standardized values STDA and STDB in every step.

Figure 9:
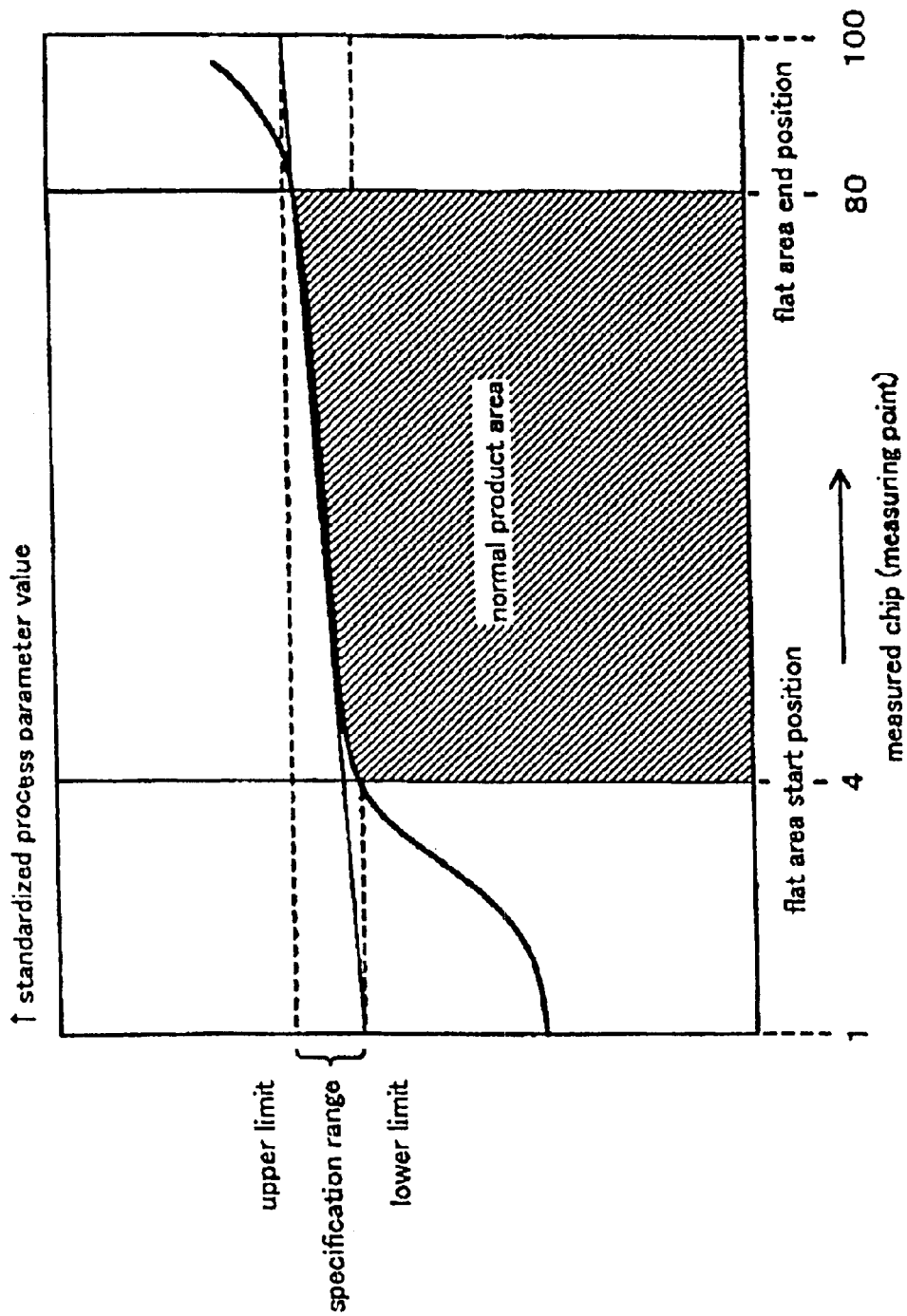
FIG. 9 is a conceptual figure for explaining a flow for obtaining the step yield at a finished time in every step.

The estimated yield operation unit 1a counts the number of normal products fallen in the hatched area shown in FIG. 9 after each step is completed.

That is, the measured data of chips are arranged from minimum to maximum and counts the chips having measured data fallen in the range between the upper limit value STDA and the lower limit value STDB as normal chips.

Incidentally, ordinate in FIG. 9 indicates the standardized measured value and abscissa indicates the number of chips when the standardized measured values are arranged from minimum to maximum. When a plurality of chips having identical measured values exist, these chips are numbered by different numbers.

By dividing the number of normal products by the number of measured products in every wafer, it is possible to obtain a wafer yield. Further, by dividing the number of normal products in a lot including the measured chips in the respective wafers by the number of the measured chips of the lot, a lot yield can be obtained.

A relation between the range of the specification and the number of normal chips is stored in the database 2, correspondingly to the lot number as shown in the table in FIG. 10.

In FIG. 10, the range of the specification of process parameters is shown in every process step number.

For example, the process step 1a may be the photolithographic step of forming a resist pattern of contact holes when the contact holes are formed.

Since one of the process parameters in the step 1a is a diameter of a hole of the contact hole pattern, the range of the specification may be defined by the user as an upper limit value of 2 $\mu$m and a lower limit value of 1.5 $\mu$m. Numerical values parenthesized in the upper and lower limit columns are standardized upper limit value STDA and standardized lower limit value STDB.

Similarly, the step 1b may be the etching step of forming the contact holes by etching the insulating film down to the diffusion layer with using the resist pattern formed in the step 1a.

Further, since the process parameter in the step 1b is a bottom area of the contact hole formed in the insulating film, the upper limit value of 12.6 $\mu$m$^2$ and the lower limit value of 7 $\mu$m$^2$ of the specification range of the bottom area are defined by the user.

The item "Flat Region Start Position" in the step 1a shown in the table in FIG. 10 indicates a chip number of a chip having contact hole diameter equal to or larger than the lower limit value of the specification range and the item "Flat Region End Position" indicates a chip number of a chip having contact hole diameter larger than the upper limit value of the specification range.

On the basis of this table, all chips measured in a lot are arranged in a sequence from one having minimum contact hole diameter to one having maximum contact hole diameter and numbered in a similar manner to that shown in FIG. 9 and the estimated yield operation unit 1a calculates the normal chips having contact hole diameters fallen in the specification range of the lot.

The number of normal products can be obtained by an equation [(chip number in the flat region end position)−(chip number in the flat region start position)].

That is, the estimated yield operation unit 1a obtains the step yields at ends of the respective steps by selecting a plurality of wafers (or all wafers) in the lot at ends of the respective steps, obtaining a total number of measured chips in the plurality of the wafers in the lot and dividing a total number of chips of the lot, which have contact hole diameters fallen within the specification range, by the total number of the measured chips.

For example, in FIG. 9, it is assumed that the total number of the measured chips in the lot is 100. In such case, the step yield in the step 1a becomes 76%, which is obtained by dividing the number of normal chips (=80 (chip number in the flat region end position)−4(chip number in the flat region start position)) by 100.

Now, a calculation method of the estimated yield will be described.

The estimated yield is obtained by multiplying the step yield with a correction value.

The correction value is obtained statistically on the basis of the past records and is a coefficient for determining whether or not the step yield obtained in each step becomes the final yield at a time point when all of the production steps are completed.

That is, the correction value is obtained by averaging values obtained by dividing the final yield by the step yields in the respective steps in a plurality of the past lots and is obtained in every step.

Further, this correction value depends upon the kind of process (production line) and the inputting manner of lot production method). Therefore, the estimated yield operation unit 1a selects one of a plurality of correction values in every step correspondingly to a combination of the production line and the production method.

The kind of process may include a design rule classified according to a table shown in FIG. 11.

In the "Production Line Number" column shown in FIG. 11, the line numbers of production lines along which the production devices are arranged in a clean room.

The values shown in the "Design Rule" column are ranges of width of such as a gate of MOS transistor in designing state and indicate production accuracy obtainable in the respective production lines.

Further, the inputting manner of lot includes a fast delivery priority course production method 1), a delivered number priority course (production method 2), a total cost priority course (production method 3) and a quality priority course (production method 4), for example, as shown in FIG. 12.

The fast delivery priority course is selected in a case where semiconductor devices to be incorporated in some products for purpose of trial manufacture are produced and the processing speed of the semiconductor devices in a selected production line 10 (FIG. 1) are performed as a matter of the highest priority, while neglecting the number and quality of delivered normal products.

Therefore, the cost per semiconductor device produced by the fast delivery date priority course becomes very high.

In the delivery number priority course, the processing is performed at a standard speed in the production line 10 and the number of the normal products delivered on the appointed date of delivery is considered as a matter of the highest priority.

In the total cost priority course, the required processing is performed along a selected production line 10 during a time zone or zones in which the production line is not at work. Therefore, it is possible to reduce the production cost since the unused time zone of the production line 10 can be utilized effectively although it takes long time to complete the production.

That is, according to the total cost priority course, it is possible to reduce the cost per semiconductor device although the production time becomes long.

In the quality priority course, the processing of a lot is performed after the processing of the respective process steps in the respective production devices 11 in the respective production lines 10 are checked preliminarily. Therefore, the cost per semiconductor device becomes very high since the processing times in the respective steps becomes considerable and the process checks are troublesome.

Further, since, in the quality priority method, the specification ranges of the measured process parameters in the respective steps are reduced in order to improve the quality of the semiconductor products to be delivered, the number of normal chips obtainable from a lot is reduced and the cost per chip becomes very high although the semiconductor chips having specifications satisfying a user can be realized.

Therefore, when, for example, the estimated yield is obtained from the step yield in the step 1b for forming the contact holes by etching, the correction value to be multiplied with the step yield when the semiconductor devices are produced by a production line 2 (FIG. 11) is set to 0.1 for the fast delivery priority course 1, to 0.8 for the delivery number priority course 2, to 0.9 for the total cost priority course 3 and to 0.2 for the quality priority course 4.

The reason for why the correction value for the fast priority course 1 is small is that the final yield becomes very low because, in order to produce the semiconductor devices with delivering date as a matter of the highest priority, the specification range is widened and the production is continued using values out of the specification ranges of normal product as reference values.

The reason for why the correction value for the quality priority course 4 is small is that the number of normal products is substantially reduced and the final yield becomes low because, in order to produce the semiconductor devices with quality as a matter of the highest priority, the specification range is narrowed and the manufacturing is continued using the specification range, which is narrowed compared with the conventional specification range of normal product as reference values.

The selections of the production line and the production method are performed by using a user terminal such as the user terminal U1 correspondingly to the design rule of the lot and the application of the chip to be produced by the user.

The data set by the user in the format shown in FIG. 13 is stored in the database 2.

In FIG. 13, the "Order Form" and the "Process Steps" are stored correspondingly to the name (CCCI) of user who orders the production.

The order form column includes "Name of Product", "Lot Number", "Production Method" and "Line Name" columns.

In the "Product Name" column, a product name (alpha) is indicated and, in the "Lot Number" column, a lot number (XX) is indicated.

Further, in the "Production Method" column, the course (fast delivery date priority) selected for the lot by the user from the production method courses shown in FIG. 12 is indicated, as an example.

In the "Line Name" column, a production line number (production line 1) selected by the user from the production lines shown in FIG. 11 correspondingly to the design rule of the lot is indicated.

In the "Process Steps" column of the selected production line on the right side of the order form column, only the process steps 1a and 1b are included in the sequence of the process flow, that is, in a similar sequence to that shown in FIG. 10.

The process step 1a is the photolithographic step for patterning the contact holes, and the process step 1b is the etching step for forming the contact holes, etc., for example. Other process steps are similarly indicated although not shown.

In each of the process step columns, "Prearranged Date", "Date of Completion" and "Estimated Yield" columns are included.

The prearranged date (data of prearranged date on which the related process step is performed) is a prearranged date for performing the process step in every lot, which is obtained on the basis of the input date of lot, the data of requested date of completion and the kind of production method, which are inputted by the user after the production managing unit 1b performs a regulation with respect to other lots, which are being processed in other production lines assigned by the user.

That is, the production managing unit 1b detects a date on which the processing is possible in a "processing schedule table" of every process step on the basis of the kind of production method, the lot input date and the requested date of completion, which are inputted by the user, calculates the prearranged date for the processing of the lot corresponding to these data and stores the calculated prearranged date in the database 2 correspondingly to the lot number.

The processing schedule table is a schedule table showing a processing date and hour schedule of a lot flowing through a production line in every step of the production line and is produced by the production managing unit 1b.

The production managing unit 1b performs the process step management of the respective lots by managing the operations of the respective production devices 11a, 11b, 11c, . . . , on the basis of the processing schedule table and transmits the measured data of the process parameters corresponding to the respective steps, which are measured by the in-line testers 12a, 12b, 12c, . . . , to the server 1 after the respective process steps are completed.

The server 1 stores the measured data from the production managing unit 1 in the database 2 correspondingly to the respective lots.

The "date of completion (completion date data)" column indicates a date on which the process steps for the lot are actually executed and this column is blank (data is not inputted) for a lot the process steps of which are not completed.

The estimated yield column indicates an estimated yield obtained by the above described estimated yield calculation performed on the basis of measured data measured after the step processing in, for example, the step 1a is completed.

The table shown in FIG. 13 is displayed on a display screen of the user terminal U1 (or U2, U3) when the user asks for progress of the lot by inputting the lot number through the user terminal U1 (or U2, U3).

In this case, the server 1 extracts a block of data corresponding to the lot number inputted by the user through the user terminal U1, that is, the respective data shown in the table in FIG. 13, from the database 2 and outputs the data block to the user terminal U1.

The respective data of the requested lot sent from the server 1 are displayed on the display screen of the user terminal U1 in the table format shown in FIG. 13.

The table shown in FIG. 10 is displayed on the display screen of the user terminal U1 by clicking "prearranged date", "completion date" and "estimated yield" columns in the process step 1a in the table shown in FIG. 13 by using a mouse.

Correspondingly to the clicked column of the process step in FIG. 13, a background color of the process step column in the table shown in FIG. 10 is changed, so that the user can confirm the measured data of the corresponding process steps and the specifications of the process parameters, etc.

In this case, the server 1 extracts data blocks of the respective process steps in the lot corresponding to the lot number requested by the user, that is, the respective data shown in FIG. 10, from the database 2 on the basis of the lot number inputted by the user through the user terminal U1 and outputs them to the user terminal U1.

The respective data of the lot outputted from the server 1 correspondingly to the requested lot number is displayed on the display screen of the user terminal U1 in the table format shown in FIG. 10.

Further, by clicking "lot number" column in the table shown in FIG. 13, a table shown in FIG. 14 is displayed.

In this case, the server 1 extracts data blocks of the respective steps in the lot corresponding to the lot number requested by the user through the user terminal U1, that is, the respective data shown in FIG. 14, from the database 2 on the basis of the lot number inputted by the user through the user terminal U1 and outputs them to the user terminal U1.

Then, the respective data of the lot outputted from the server 1 correspondingly to the requested lot number are displayed on the display screen of the user terminal U1 in the table format shown in FIG. 14.

The table shown in FIG. 14 shows the history of production process of semiconductor devices of every lot and shows respective data, which become the base of the production management by the user. The data shown in this table will be described sequentially.

In a column corresponding to "calculation date", the date on which data to be described are written in.

In a column corresponding to "current process step", names of process steps such as "lot input date" on which a lot is thrown-in and "contact (steps 1a and 1b)", etc., are indicated.

In the column "prearranged date of completion (data of prearranged date of completion)", either a desired date of completion inputted by the user or a prearranged date of completion calculated by the production managing unit 1b at a time when the processing in the respective process steps is completed.

The production managing unit 1b obtains a prearranged date of completion after regulations in the prearranged processing table of the respective steps on the basis of the lot input date (data of lot input date and hour), a desired date of completion (data of desired date of completion) and the kind of production method and stores the prearranged date of completion in the database 2 correspondingly to the lot number.

This prearranged date of completion is usually calculated by the production managing unit 1b and is changed at an end of the process step on the basis of the working rate of the production line through which the lot is flowing and regulations with respect to other lots.

In the column "expected number of delivery", an expected number of normal semiconductor devices, which is calculated by the estimated yield operation unit 1a on the basis the estimated yields calculated at end times of the respective steps and a total number of chips of the lot, is indicated.

In the "unit cost of chip" column, a cost per normal semiconductor device (chip), which is obtained in the estimated yield operation unit 1a by dividing the "total cost" of the production of this lot by the prearranged number of normal chips, is indicated.

In this case, the estimated yield operation unit 1a estimates a final cost of the semiconductor device at the end time of every process step.

In the "total cost" column, the above mentioned total cost of the production of the lot is indicated.

When some change is performed in the processing in the process steps in the lot, a description corresponding to that change is indicated in the "remarks" column.

For example, when the width of the resist pattern is deviated from the specification range and the estimated yield calculated is very low in the photolithography step 3a in the wiring step, the photolithography step must be performed again.

When the user notifies the server 1 of the re-try of the wiring step, the server 1 must control the production process in order to remove the resist and to perform a new photolithographic process. Therefore, a character data "100% re-operation selected" is indicated in the remarks column.

The production managing unit 1b regulates the date and hour for the re-operation of the photolithography step on the basis of the processing schedule table.

In such case, the server 1 indicates a character data "100% re-operation" in the remarks column in order to perform the new photolithography step.

The estimated yield operation unit 1a operates a new estimated yield at the end point of the re-processing in this step, updates the data by calculating the prearranged delivery number of products and the unit cost of chip again on the basis of the newly estimated yield and indicates the updated data in the corresponding column.

As described, the production managing system for semiconductor device, according to the present invention, is constructed with the semiconductor producing center C, which is connected to the user terminals through the information communication line and includes the plurality of the production devices 11a, 11b, 11c, . . . , the in-line testers 12a, 12b, 12c, . . . , provided next to the respective production devices for measuring the process parameters corresponding to the process steps performed in the respective production devices and outputting the results of the measurements as the measured data in units of lot, the database 2 for storing the managing data of every lot, which include the production method data, the measured data, the specifications of the process steps corresponding to the measured data, the estimate yield, the data of lot input date, the data of scheduled date of process step, the data of the process step completion date and the data of the prearranged date of completion of the semiconductor devices, etc., which are described with reference to FIG. 5 to FIG. 15, in every process step corresponding to the lot number assigned to the lot of the semiconductor devices (that is, in every process step in a region of the wafers corresponding to the lot number) and the server 1 including the estimated yield operation unit 1a for calculating the estimated yield on the basis of the specifications and the measured data and the production managing unit 1b for managing the production of the ordered semiconductor devices on the basis of the managing data and the data of desired date of completion.

The server 1 performs write and read of the specifications, the desired date of completion (desired completion date data) and the lot input date (data of the lot input date), which are inputted by the user through the user terminals U1, U2, U3, and the managing data with respect to the database 2.

Figure 16:
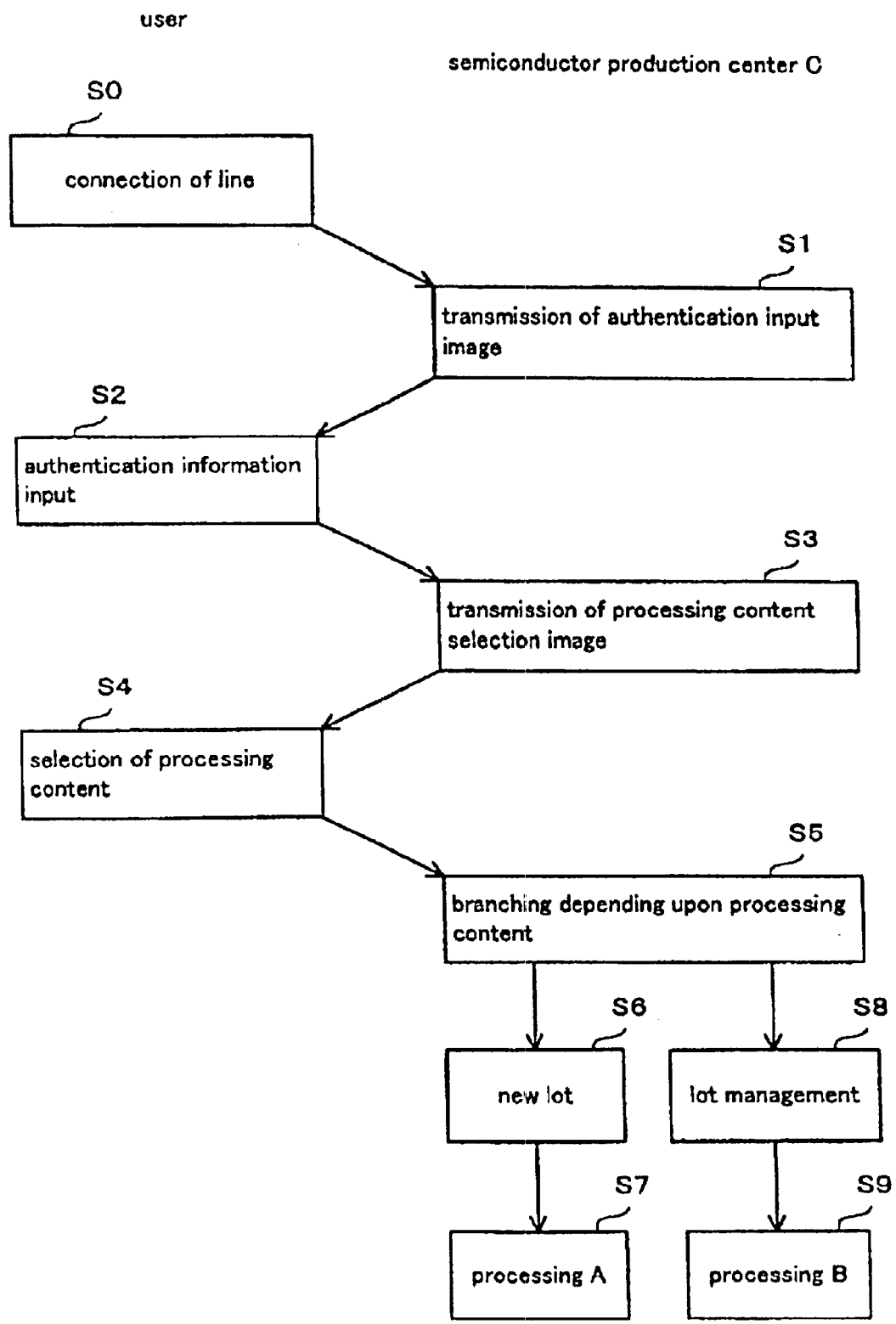
FIG. 16 is a flowchart of a portion of a semiconductor device production managing system, in which a process selection of a lot is performed.

The table of a wafer input portfolio shown in FIG. 16 is displayed on the display screen by clicking the region in the "product name" column shown in FIG. 13 in which the product name is indicated.

In this case, the server 1 extracts, from the database 2, the data showing the construction of the wafer input portfolio corresponding to the product name requested by the user, that is, the data shown in the table in FIG. 15, on the basis of the product name inputted by the user through the user terminal U1 and outputs the extracted data to the user terminal U1.

The respective lot data outputted from the server 1 correspondingly to the requested product name is displayed on the display screen of the user terminal U1 in the table format shown in FIG. 15.

That is, when the lot is processed according to the portfolio construction, a group of wafers is formed by one product name. Therefore, all of the lot numbers of a group in one product name are displayed in FIG. 15 even when the lot having the lot number in the product name group is to be confirmed in performing the production management.

Therefore, the user is required to confirm the prearranged number of normal products in individual lot on the basis of the prearranged delivery number of products in the table shown in FIG. 14.

In the table shown in FIG. 15, products having an identical product name are produced in a plurality of lots. Although there is a case where the lots are different lots, the products may be produced by dividing one lot to a plurality of sub lots.

For example, in a case where one lot can sufficiently cover a sum of the number of chips necessary to be produced quickly as engineering samples (ES), the number of chips necessary to be delivered as samples and the number of chips necessary for reliability test, the required production method is assigned by dividing one lot to a plurality of sub lots and assigning the sub lots to different processes.

For example, in FIG. 15, the semiconductor devices having the clicked product name are produced by dividing a lot having lot number "XX" to three sub lots numbered "XXA", "XXB" and "XXC" and assigning the production method 1, the production method 2 and the production method 3 to the three sub lots, respectively.

The item "Mixing Ratio %" in FIG. 15 indicates the constitutional ratio of the sub lots having lot numbers "XXA", "XXB" and "XXC" in one product name group.

Assuming that 10 wafers in the three sub lots having the same product name are being produced, the number of wafers having sub lot number "XXA" is 6 since the mixing ratio thereof is 60%, the number of wafers having sub lot number "XXB" is 2 since the mixing ratio thereof is 20% and the number of wafers having sub lot number "XXC" is 2 since the mixing ratio thereof is 20%.

In the "initial chip delivering date" column in FIG. 15, the prearranged date of completion in the course of the production method with which the semiconductor devices are completed most quickly and which is determined on the basis of the calculation of the prearranged dates of completion in the respective production courses performed by the production managing unit 1b is indicated.

Further, the value in the "predicted number of normal products" column in FIG. 15 is a total number of normal products in all of the production courses, which is obtained on the basis of the prearranged number of delivered chips calculated in every sub lot by the estimated yield operation unit 1a on the basis of the estimated yields of the respective process steps.

In addition, the value in the "predicted chip cost" column in FIG. 15 is a result of calculation of unit cost of chip in each of the sub lots, which is obtained by averaging the unit chip costs for all of the sub lots constituting the estimated portfolio by the estimated yield operation unit 1a.

That is, the wafer input portfolio shown in FIG. 15 is similar to the portfolio usually utilized by stock companies and banks, etc., and indicates a combination of production methods of lots for obtaining chips as the working profit with low cost and high profit, by considering the number of finally obtainable chips (corresponding to the profit with respect to investment) and the chip delivering date (corresponding to a term of investment).

By confirming the initial chip delivering date and the predicted chip cost, the user determines whether or not the number of chips finally required and the date on which the normal chips can be obtained corresponds to his request.

Now, an operation of the semiconductor device production managing system according to an embodiment of the present invention will be described with reference to FIG. 16 to FIG. 18.

FIG. 16 is a flowchart showing an operation of the semiconductor device production managing system for selecting one of the user operations, that is, the input operation a new lot, and the operation for performing the production management of the lot already thrown in.

Figure 17:
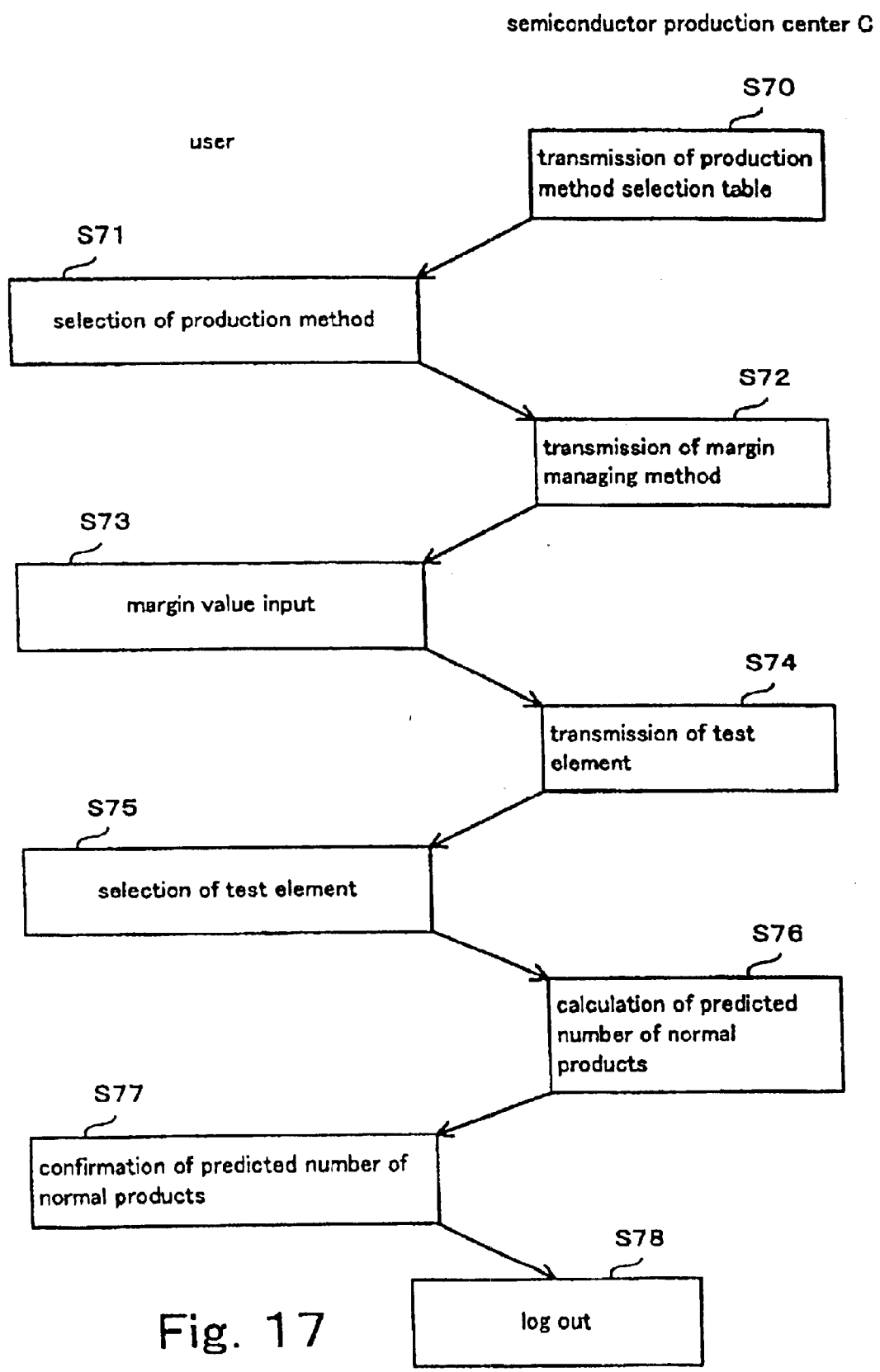
FIG. 17 is a flowchart of a portion of the semiconductor device production managing system, in which a throwing-in of a new lot is performed.

FIG. 17 is a flowchart showing a flow of processing when the user inputs a new lot.

Figure 18:
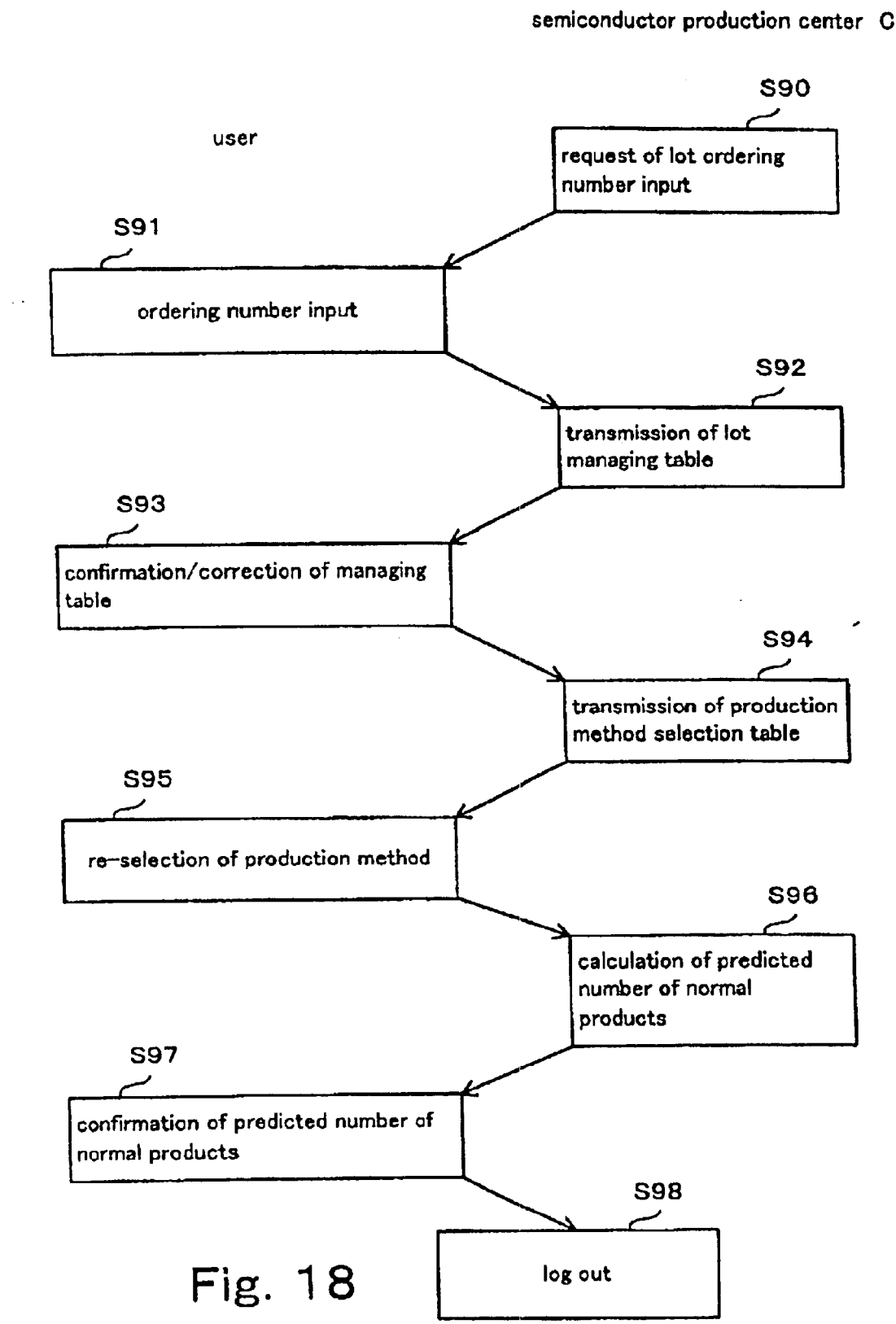
FIG. 18 is a flowchart of a portion of the semiconductor device production managing system, in which a production management of already thrown-in lot is performed.

FIG. 18 is a flowchart shows a flow of processing for performing the production management of the lot already thrown in by the user.

The flowchart shown in FIG. 16 will be described. In this example, it is assumed that an internet is used as the information communication line I.

In the step S0, the user inputs URL (Uniform Resource Locator) of the semiconductor production center C from an input device such as key-board of the user terminal U1 to a browser provided in the user terminal U1 to connect the internet to the server 1 of the semiconductor production center C.

Next, in the step S1, the server 1 transmits an image of a web page of the semiconductor device production center C as a display image to the user terminal U1 in HTML format according to a program stored in an internal memory of the server 1.

The display image contains an input portion (authentication input screen) to which a user ID and a password, which are shown in FIG. 19, for confirming the user, are inputted.

Next, in the step S2, the user terminal U1 displays the display image of the web page transmitted from the server 1 by the browser of the user terminal U1 on the display screen thereof.

Then, the user inputs the preliminarily given ID number and password of the user, which are preliminarily registered in the server 1, to the input portion shown in FIG. 19 on the display screen of the user terminal U1.

Thus, the browser of the user terminal U1 transmits the inputted ID number and the inputted password of the user to the server 1.

Next, in the step S3, the server 1 determines whether or not the inputted ID number and password are registered on the database 2.

In this case, when the server 1 determines that the inputted ID number and password are not registered in the database 2, the operation is returned to the step S1 to allow the user to input the correct ID number and the correct password again.

When, for example, the input operation of one of the inputted ID number and the inputted password is erroneous a preset number of times, for example, three times, the server 1 stops a signal transmission/receiving with the user terminal U1 once by cutting off the communication line.

On the other hand, when the server 1 determined that the inputted ID number and password are registered in the database 2 in the step S3, the server 1 transmits a processing content selection image shown in FIG. 20 to the user terminal U1 similarly to the authentication input image.

The processing content selection image shown in FIG. 20 includes "new lot input" and "production management". The "new lot input" indicates the processing of input of a new lot and the "production management" indicates the processing of the production management of the lot, which was already thrown-in and is being flown through the production line.

Next, in the step S4, the user terminal U1 displays the processing content selection image shown in FIG. 20 and transmitted from the server 1 on its display screen.

The user can perform a requested processing by clicking any of the contents on the processing content selection image displayed on the display of the user terminal U1.

In this case, the user terminal U1 transmits the information selected by the clicking to the server 1.

Next, in the step S5, the server 1 determines the processing requested by the user on the basis of the selected information inputted from the user terminal U1.

That is, when the server 1 determines, in the step S6, that the selected information is the input processing of a new lot, the operation is shifted to the step S7 in which the processing A for inputting the new lot is performed.

On the other hand, when the server 1 determines, in the step S8, that the selected information is the processing for performing the production management of the already flowing lot, the operation is shifted to the step S9 in which the processing B for the lot management is performed.

Now, the processing of the newly inputted lot in the step S7 will be described with reference to the flowchart shown in FIG. 17.

In the step S70, the server 1 determines the lot number of the lot to be newly thrown in and provides a data region of the new lot in the database 2.

And then, the server 1 transmits an image of a selection table shown in FIG. 12 for selecting one of the lot production methods and an image of the table shown in FIG. 11 for selecting one of the production lines for treating the lot to the user terminal U1.

Then, in the step S71, the user terminal U1 displays, on its display screen, the image of the selection table and the image of the table for selecting one of the production lines for treating the lot, which are transmitted from the server 1.

The user selects one of the production methods for the lot to be newly thrown in, by clicking one of "1: Fast Delivery Date Priority" course, "2: Number of Products Delivered on Date of Delivery Priority" course, "3: Total Cost Priority" course and "4: Quality Priority" course in the image shown in FIG. 12.

Similarly, the user selects one of the production lines for the lot to be newly thrown by clicking one of "line 1: 0.1–0.13 $\mu$m", "line 2: 0.13–0.15 $\mu$m", "line 3: 0.15–0.18 $\mu$m", "line 4: 0.18–0.25 $\mu$m", "line 5: 0.25–0.35 $\mu$m" and "line 6: 0.35 $\mu$m or more" in the production line selection table shown in FIG. 11.

In this case, the user inputs the input date of the lot to be newly thrown in and the desired date of completion to the user terminal U1 through the key board thereof, etc.

The user terminal U1 transmits the data of the selected production method, the data of the selected production line, the data of the lot input date and the data of the desired date of completion to the server 1.

Next, in the step S72, the server 1 stores the data of the selected production method, the data of the selected production line, the data of the lot input date and the data of the desired date of completion inputted from the user terminal U1 in the database 2 corresponding to the lot number newly registered.

The lot number of the lot to be newly thrown in is obtained by the server 1 by adding "1" to the final lot number of the lot, which is being flown.

The server 1 transmits the image of the specification setting screen shown in FIG. 7 for inputting the specification ranges in every process step and the data of the lot number newly registered to the user terminal U1.

And then, in the step S73, the user terminal U1 displays the specification setting image shown in FIG. 7 on its display screen and stores the given lot number in an internal managing table thereof correspondingly to the product name, the lot input date and the desired date of completion.

The user inputs marginal values, that is, the specification range in every process step by clicking the display screen with using such as a mouse.

In this case, the user may input the specification ranges of the process parameters sequentially through the keyboard of the user terminal in every step selected by clicking the specification ranges shown in FIG. 7.

And then, in the step S74, the server 1 stores the data of the specification ranges of the respective steps inputted from the user terminal U1 in the database 2 correspondingly to the lot number of the lot, which is newly thrown in and registered.

And then, the server 1 transmits to the user terminal U1 a selection image for selecting the kind of test element, which has parameters shown in FIG. 6 and is to be measured, and an image for selecting positions on the wafers to be measured.

Then, in the step S75, the user terminal U1 displays the selection image for selecting the kind of test element having parameters shown in FIG. 6 and the image for selecting positions on the wafers to be measured on its display screen.

The user selects the test element to be used by clicking the image for selecting the king of the test element displayed on the display screen of the user terminal U1 and, simultaneously, selects the measuring points on the wafer in every step by clicking the image for selecting positions on the wafers to be measured.

The user terminal U1 transmits the element data indicative of the selected element and the measuring position data indicative of positions on the selected measuring points to the server 1.

Thereafter, in the step S76, the server 1 stores the element data and the measuring position data, which are inputted from the user terminal U1, in the database 2 correspondingly to the lot number of the lot newly thrown and registered.

In order to calculate the predicted number of normal products when the new lot is thrown in, the server 1 extracts the estimated yield in the past combination of the production method and the production line, on the basis of the production method course and the production line from the database 2.

Then, when the lot is inputted, the server 1 calculates the predicted number of normal products by multiplying the extracted estimated yield with a total number of chips of this lot.

The server 1 transmits the calculated predicted number of normal products when the new lot is thrown in to the user terminal U1.

In the step S77, the user terminal U1 displays the predicted number of normal products transmitted from the server 1 on the display screen thereof.

The user confirms the displayed predicted number of normal products on the display screen of the user terminal and determines whether or not a finally required number of chips can be obtained.

In this case, when the predicted number of normal products is smaller than the required number of chips, the user clicks a region "insufficient" on the display screen.

Thereafter, the user terminal U1 transmits a request data requesting an input (re-input) of a new lot to the server 1 together with the number of new lots.

In response to this request data from the user terminal U1, the server 1 returns the operation to the step S6 and performs the processing in this step under the same product name with using a different lot number for the newly thrown lot. The lot input processing for re-inputting lot is similar to that for the usual input processing of the lot as described previously.

That is, the estimated yield operation unit 1a and the production managing unit 1b of the server 1 produce a production schedule on the basis of the desired date of completion, which is inputted by the user through the user terminal U1, and perform the processing such as calculation of data including the data of prearranged date of completion on the basis of the production schedule similarly to the previously described case of the input of the lot.

In this case, the data of lot input date is made data of re-input date and the number of wafers, which is inputted, is made data of the number of re-inputted wafers. The data of re-input date and the data of the number of re-input wafers are stored in the database 2 corresponding to the lot number of the re-input lot and treated as an input of new lot as described above.

Further, in the step S77, the user can perform the dividing processing of the lot as shown in FIG. 21 after the predicted number of normal products is confirmed.

That is, when the user requests the server 1 of the dividing processing of the lot through the user terminal U1, the server 1 transmits a selection table image of the dividing processing shown in FIG. 21 to the user terminal U1.

The user terminal U1 displays the selection table image of the dividing processing transmitted from the server 1 on its display screen.

The user selects a method for dividing the lot by clicking the selection table displayed on the display screen of the user terminal U1.

The selection table includes three kinds of courses, that is, "course 1" in which no division is performed, "course 2" in which the lot is divided by two and "course 3" in which conditional division is performed.

The "course 1" in which the lot is not divided is the same as the case where the lot is flown usually.

The "course 2" in which the lot is divided by two is used in a case where the desired number of chips must be obtained in a limited term. In such case, in order for diversification of risks, the lot is divided to two sub lots (or to a plurality of sub lots on demand) and the semiconductor devices are produced in the production lines by staggering the processing time.

In the "course 3" of the conditional branching of the lot, one lot is divided to a plurality of sub lots and the production is performed by changing the production method for the respective sub lots so that the portfolio shown in FIG. 15 is realized by the one lot.

In this case, when the lot number of the lot before division is "XX" and the lot is divided to three sub lots, the lot numbers of the sub lots become "XXA", "XXB" and "XXC".

From this time point, the calculations of the respective data including the process step management, the estimated yield, described with reference to FIG. 13 to FIG. 15, are started for the newly inputted lot by the estimated yield operation unit 1a and the production managing unit 1b.

That is, after the processing shown by the flowchart in FIG. 17, the process management of the lot is performed by the production managing unit 1*b* on the basis of the tables shown in FIGS. 13 and 14 and the prearranged processing table of the process steps in the production line to which the lot is thrown (for example, any one of the production lines 1 to 6) and, after the processing of the respective steps are completed, the process parameters corresponding to the respective steps are measured by the in-line testers (12*a* to 12*c*).

The estimated yield operation unit 1*a* calculates the data such as the estimated yields at end times of the respective process steps on the basis of the measured data.

Since, in the production managing system for semiconductor devices, according to the present invention, the final estimated yield is calculated at the time when the lot is inputted, it is possible to effectively utilize the lot dividing processing as described below.

In the present production managing system for semiconductor devices, the usual lot can be divided to a plurality of sub lots each including the required number of chips on the basis of the estimated yield at the time of the input of the lot and the execution times of the sub lots are staggered each other such that, when one of the sub lots becomes defective due to process problem and/or production device, a succeeding sub lot is executed. Therefore, it becomes possible to reliably produce the desired number of chips within a predetermined time period.

Further, when the "course 3" in which the lot is conditionally divided is used in the production managing system for semiconductor devices is used and the constructions of the portfolio are appropriately combined on the basis of the number of chips to be produced in different production lines according to objects and the production times required thereby on the basis of the estimated yield at the times when the sub lots are thrown in, it becomes possible to produce the engineering chips required initially, which are to be produced quickly, the chips produced by the quality priority production method, which are necessary in the reliability test and the finally required chips within the respective required time periods and with reduced total cost.

Further, although the portfolio has been described by dividing one lot to a plurality of sub lots, it is possible to perform the portfolio by using a plurality of lots in lieu of the sub lots since the management thereof is similar to the management of a plurality of lots as a group under one "product name".

Now, the processing of the production management of the already inputted lot in the step S9 will be described with reference to the flowchart shown in FIG. 18.

In the step S90, the server 1 transmits an input image for inputting the lot number of the lot to be production managed to the user terminal U1.

Then, in the step S91, the user terminal U1 displays the input image transmitted from the server 1 on its display screen.

The user inputs the lot number of the lot, the production of which is to be managed, on the displayed input image by using a keyboard, etc., of the user terminal U1.

The user terminal U1 transmits the data of the inputted lot number to the server 1.

In the step S92, the server 1 searches the database 2 on the step management table (FIG. 13) of this lot on the basis of the lot number data inputted from the user terminal U1.

And then, the server 1 transmits an image of the searched step management table to the user terminal U1.

In the step S93, the user terminal U1 displays the image of the step management table shown in FIG. 13 inputted from the server 1 on its display screen.

And then, the user confirms the predicted date of step completion, the actual date of step completion and the estimated step yield for every step on the step management table of this lot and determines whether or not the required time period and the required number of chips are in the satisfactory states by reading the tables shown in FIG. 14 and FIG. 15 from the database 2 by using the step management table shown in FIG. 13 and confirming the prearranged date of completion of the semiconductor devices, the unit cost of chip, the predicted number of chips delivered, the total cost, the initial chip delivering date, the number of normal products and the predicted chip cost.

In this case, when the numerical values in the respective tables shown in FIG. 13 and FIG. 14 are satisfactory, the user performs the log out processing in the step S98 under consideration of re-confirmation on the predicted date of completion of the next step and cuts off the connection to the server 1.

On the other hand, when the numerical values in the tables shown in FIG. 13 and FIG. 14 are not satisfactory, the user must consider on the production method and the continuation of the production of the lot.

For example, when the estimated yield of the lot number "XXA" of one of the three sub lot, which is produced as the engineering samples by the production method 1 is not satisfactory and an enough number of normal products can not be produced even if the production is performed continuously, the user changes the production method 2 of the lot number "XXB" to the production method 1.

When the estimated yield calculated after the step processing becomes lower than the desired yield preliminarily set by the user and there is no access from the user within a constant time period, for example, within one day after the step providing the low estimated yield is finished, the server 1 transmits a mail to the user terminal U1 for notifying the calculated low estimated yield and the step corresponding to this estimated yield.

The desired yield is transmitted simultaneously with a transmission of the specifications of the respective steps in FIG. 7 from the user to the server 1.

The server 1 stores the desired yield correspondingly to the respective steps of every lot number.

In this case, the user inputs, through the keyboard, etc., the lot number "XXB" and a changing instruction of the production method for the lot number "XXB" and the lot number "XXA" and an instruction requesting a selection whether or not the production of the lot having the lot number "XXA" is continued.

The user terminal U1 transmits the change request data for changing the production method of the lot number "XXB" and the selection request data requesting the determination of whether or not the production of the lot number "XXA" is to be continued to the server 1.

The, in the step S94, the server 1 transmits the step management table shown in FIG. 13 and a table shown in FIG. 22 for determining whether or not the lot production is to be continued further to the user terminal U1 on the basis of the change request data and the selection request data, which are inputted from the user terminal U1.

In the step S95, the user terminal U1 displays the table shown in FIG. 13 corresponding to the lot having the lot number "XXB" and the table shown in FIG. 22 corresponding to the lot having the lot number "XXA" on the display screen thereof.

The user displays the selection table shown in FIG. 12 by clicking the production method column of the FIG. 13 on the display screen of the user terminal U1 and clicks the production method to be changed.

When the user clicks the production method 1, the production method of the lot number "XXB" is changed from the production method 2 to the production method 1.

The user terminal U1 transmits a production method changing instruction including the data of the lot number of the lot in question to the server 1.

Further, when the estimated yield of the lot number "XXA" is unsatisfactory and the production of that lot is to be stopped, the user clicks the region of "3 stoppage".

The user terminal U1 transmits a production stop instruction for stopping the production of the lot number "XXA" to the server 1. The production stop instruction includes the lot number of the lot in question.

In the step S96, on the basis of the inputted change instruction, the server 1 changes the data of the production method corresponding to the lot having the lot number "XXB" in the database 1 from the production method 2 to the production method 1.

In this case, the estimated yield operation unit 1a re-calculates the estimated yield in every changed step of the changed production method and stores the re-calculated estimated yield and other numerical values in the table shown in FIG. 14, which are calculated on the basis of the re-calculated estimated yield in the database 2 correspondingly to the lot number.

In this case, if the semiconductor devices are being produced by the portfolio, the final predicted number of normal products in FIG. 15 is re-calculated and the re-calculated final predicted number of normal products is stored in the database 2 correspondingly to the lot number.

The production managing unit 1b performs a regulation in order to make the processing schedule for the subsequent steps correspondent to the changed production method 1 of the lot number "XXB".

Further, the server 1 outputs a stop instruction for instructing stoppage of the production of the lot number "XXA" to the production managing unit 1b on the basis of the inputted production stop instruction.

The production managing unit 1b advances the sequence of the respective process steps of the lot number "XXB" so as to make them correspondent to the production method 1, deletes the lot number "XXA" from the processing schedule of the respective steps and stops the subsequent production of the lot having the lot number "XXA".

The server 1 transmits the image data of the tables in FIG. 14 and FIG. 15 corresponding to the lot number "XXB" to the user terminal U1.

In the step S97, the user terminal U1 displays the image data of the tables in FIG. 14 and FIG. 15 corresponding to the lot number "XXB" inputted from the server 1 on the display screen thereof.

The user determines, on the basis of the table shown in FIG. 14 and the table shown in FIG. 15, whether or not the estimated yield, the predicted number of normal products and the initial chip delivering date are satisfactory.

When the values shown in the tables in FIG. 14 and FIG. 15 are unsatisfactory, the user repeats the processing in the step S93.

On the contrary, when the values shown in the tables in FIG. 14 and FIG. 15 are satisfactory, the user shifts the operation to the step S98 and cuts off the connection to the server 1.

On the other hand, when, in the step S93, the user determines that the estimated yield of the lot number "XXA" (after the step in which the confirmation is performed) is very high and the required number of chips can be achieved by a half of the current number of chips or smaller, the user inputs a selection instruction requesting a selection of continuation or stoppage of the production of the lot number "XXA" through the keyboard, etc.

The user terminal U1 transmits the selection request data for the lot having the lot number "XXA" to the server 1.

Then, in the step S94, the server 1 transmits the table shown in FIG. 22, for instructing continuation or stoppage of the production of the lot, to the user terminal U1.

In the step S95, the user terminal U1 displays the table in FIG. 22 corresponding to the lot having the lot number "XXA" and transmitted from the server 1 on the display screen thereof.

The user clicks the region "2: 50% continue" in the table in FIG. 22 displayed on the display screen to reduce the number of chips to be produced to a half.

The user terminal U1 transmits a number change instruction for making the number of the wafers (the chips) in the lot having the lot number "XXA" one second to the server 1. This number change instruction includes the lot number of the lot in question.

In the step S96, on the basis of the number change instruction inputted from the user terminal U1, the server 1 outputs an instruction instructing the reduction of the number of wafers in the lot having the lot number "XXA" to a half to the production managing unit 1b.

Upon this, the production managing unit 1b changes the processing number of the wafers in the lot having the lot number "XXA" in the subsequent steps to 50%.

The estimated yield operation unit 1a calculates the prearranged delivery number of products, the cost of unit chip, the total cost and the predicted number of normal products in the lot having the lot number "XXA" in the tables shown in FIG. 14 and FIG. 15 and stores the calculated values in the database 2 correspondingly to the lot number "XXA".

According to the schedule change in the respective steps subsequent to the number change of the wafers of the lot having the lot number "XXA", the production managing unit 1b changes the data of the prearranged date of completion and the initial chip delivering date in the database 2.

In the step S95, when the user determines that the predicted number of normal products in FIG. 15 does not satisfy the required number of chips, the user returns the display to that in the step S4, clicks the region for inputting new lot on the display screen in FIG. 20 and inputs a new lot.

According to the production managing system of semiconductor devices of the present invention, the estimated yield is obtained at an end of every step and the predicted number of finally obtainable normal chips can be calculated at that time point. Therefore, when it is determined that the predicted number does not satisfy the required number of chips, the user can correspond thereto by such as the input of a new lot.

According to the present production managing system in which the estimated yield is obtained at an end of every step and the predicted number of finally obtainable normal chips can be calculated at that time point, the user can reduce the number of wafers in that lot to a value enough to obtain the required number of chips at a time when the predicted number of finally obtainable normal chips substantially exceeds the desired number of chips and perform the subsequent steps. Therefore, there is no case where unnecessary chips are produced, so that the unit cost of chip can be reduced.

Further, since, in the production managing system of semiconductor devices of the present invention, the prearranged date of completion of the semiconductor devices is calculated on the basis of the processing schedule table, FIG. 13 and FIG. 14, it becomes easy to plan the production schedule after the semiconductor devices are produced. Further, since it is possible to set the prearranged date of completion within the range of the schedule table by changing the production method by the user, it becomes possible to regulate the production cost of the semiconductor devices by regulating the prearranged date of completion correspondingly to an object.

The production management of semiconductor devices may be performed by recording a program for realizing all of the steps shown in FIG. 16 to FIG. 18, or any of the steps or any combination thereof in a computer readable recording medium, reading the program in a computer system and executing it. Incidentally, in this description, the "computer system" includes a hardware such as OS or peripheral equipment. Further, the "computer readable recording medium" means a mobile medium such as floppy disk, opto magnetic disk, ROM, CD-ROM, etc., and a memory such as hard disk housed in a computer system.

Further, the "computer readable recording medium" may include a recording medium, which holds the program for a constant time, such as a communication line, which dynamically holds the program for a short time in a case where the program is transmitted through a network such as an internet or a communication line such as telephone line or a volatile memory in the computer system, which functions as a server or a client in such case. The above mentioned program may realize a portion of the above mentioned function or may realize the function by a combination of it and a program already stored in the computer system.

In the production managing system of semiconductor devices of the present invention, the estimated yield is obtained at the end time of every step and the predicted number of normal chips obtainable finally can be calculated at that time. Therefore, when the predicted number of normal chips does not satisfy the required number of chips, the user can take measures such as a throwing in of a new lot, appropriately.

Further, according to the production managing system of semiconductor devices of the present invention, the estimated yield is obtained at the end time of every step and the predicted number of normal chips obtainable finally can be calculated at that time. Therefore, the user can regulate the number of wafers of the current lot correspondingly to the number of wafers corresponding to the required number of chips at a time when it is determined that the predicted number of normal chips substantially exceeds the required number of chips and can flow the subsequent steps. Consequently, there is no case where an excessive number of chips is produced and it is possible to reduce the cost of unit chip.

What is claimed is:

1. A system for managing the production of semiconductor devices, the system comprising:
   a plurality of production devices to perform production processes for fabricating semiconductor devices;
   a plurality of in-line measuring devices to measure at least one process parameter of each production process performed by the production devices and to output the process parameter as measured data, wherein at least one in-line measuring device of the plurality of in-line measuring devices is associated with one of the plurality of production devices such that the in-line measuring device measures a process parameter of the process performed by the associated production device;
   a data storage device to store: (i) data which is indicative of the production processes performed by the production devices, (ii) the measured data, (iii) specifications of the production processes that are associated with the measured data, (iv) data of the start of production of the semiconductor devices, (v) data of the scheduled date on which each production process is performed by the production devices, (vi) data of the date of completion of each production process performed by the production devices, and (vii) data of the scheduled date of completion of the semiconductor devices; and
   a computing device, coupled to the data storage device, the computing device including:
      an estimated yield operating unit to calculate an estimated yield of semiconductor devices using the specifications of the production processes and the measured data; and
      a production managing unit to manage the production of the semiconductor devices using the estimated yield of semiconductor devices.

2. The system of claim 1 wherein a wafer lot includes a plurality of semiconductor wafers, each semiconductor wafer contains a plurality of semiconductor devices, and wherein the plurality of in-line measuring devices output process parameters as measured for the wafers of a wafer lot.

3. The system of claim 2 wherein the plurality of in-line measuring devices output process parameters as measured for all of the wafers of the wafer lot.

4. The system of claim 2 further including a user terminal, wherein the user terminal provides: (i) the specifications of the production processes, (ii) data which is indicative of a measuring position on a wafer to be measured by an in-line measuring device, and (ii) data which is indicative of the type of the in-line measuring device.

5. The system of claim 1 wherein the estimated yield operating unit calculates an estimated yield of a wafer lot using: (i) statistical values of process parameters, (ii) the specifications of the production processes, and (iii) the measured data after the production process is performed by a predetermined production device.

6. The system of claim 1 wherein the estimated yield operating unit calculates an estimated yield for a production process performed by a production device using: (i) the specification of the production process performed by the production device and (ii) associated measured data, and wherein if the estimated yield of the production process is lower than a predetermined minimum yield, the production managing unit notifies an operator.

7. The system of claim 6 wherein if the estimated yield of the production process is lower than a predetermined yield, the production managing unit notifies an operator.

8. The system of claim 1 wherein at least one in-line measuring device irradiates through-holes, formed in an insulating film on a wafer, with electron beam.

9. The system of claim 8 wherein the at least one in-line measuring device that irradiates through-holes formed in an insulating film on a wafer measures electric current flowing through the irradiated through-holes on the wafer and outputs the measured current as the measured data.

10. The system of claim 1 wherein a semiconductor wafer contains a plurality of semiconductor devices and wherein the estimated yield operation unit calculates the estimated yield after each production process and calculates the number of acceptable semiconductor devices of a wafer or inoperative semiconductor devices of a wafer on the basis of the estimated yield.

11. The system of claim 10 wherein the estimated yield operation unit calculates estimated cost of a semiconductor device using: (a) the number of acceptable semiconductor devices or inoperative semiconductor devices and (b) a working ratio of the production device.

* * * * *